United States Patent
Alves et al.

(10) Patent No.: US 8,522,122 B2
(45) Date of Patent: Aug. 27, 2013

(54) CORRECTING MEMORY DEVICE AND MEMORY CHANNEL FAILURES IN THE PRESENCE OF KNOWN MEMORY DEVICE FAILURES

(75) Inventors: Luiz C. Alves, Hopewell Junction, NY (US); Luis A. Lastras-Montano, Corlandt Manor, NY (US); Patrick J. Meaney, Poughkeepsie, NY (US); Eldee Stephens, Waterbury, CT (US); Barry M. Trager, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 221 days.

(21) Appl. No.: 13/016,977

(22) Filed: Jan. 29, 2011

(65) Prior Publication Data

US 2012/0198309 A1  Aug. 2, 2012

(51) Int. Cl.
H03M 13/00 (2006.01)

(52) U.S. Cl.
USPC ............................ 714/785; 714/758; 714/784

(58) Field of Classification Search
USPC .......................................... 714/758, 784, 785
See application file for complete search history.

(56) References Cited

U.S. PATENT DOCUMENTS

| | | | |
|---|---|---|---|
| 4,464,747 A | 8/1984 | Groudan et al. | |
| 5,124,948 A | 6/1992 | Takizawa et al. | |
| 5,163,023 A | 11/1992 | Ferris et al. | |
| 5,272,671 A | 12/1993 | Kudo | |
| 5,463,643 A | 10/1995 | Gaskins | |
| 5,488,691 A | 1/1996 | Fuoco | |
| 5,499,253 A | 3/1996 | Lary | |
| 5,513,135 A | 4/1996 | Dell et al. | |
| 5,537,665 A | 7/1996 | Patel et al. | |
| 5,655,076 A | 8/1997 | Kimura et al. | |
| 5,680,564 A | 10/1997 | Divivier | |
| 5,684,810 A * | 11/1997 | Nakamura et al. | 714/765 |
| 6,012,839 A | 1/2000 | Nguyen | |
| 6,125,469 A * | 9/2000 | Zook et al. | 714/769 |
| 6,131,178 A * | 10/2000 | Fujita et al. | 714/784 |
| 6,332,206 B1 | 12/2001 | Nakatsuji et al. | |

(Continued)

FOREIGN PATENT DOCUMENTS

| | | |
|---|---|---|
| JP | 11144491 A2 | 5/1999 |
| WO | 2006029243 A1 | 3/2006 |

OTHER PUBLICATIONS

D. Wortzman; "Two-Tier Error Correcting Code for Memories"; vol. 26, #10, pp. 5314-5318; Mar. 1984.

(Continued)

*Primary Examiner* — Esaw Abraham
(74) *Attorney, Agent, or Firm* — Cantor Colburn LLP

(57) ABSTRACT

Correcting memory device (chip) and memory channel failures in the presence of known memory device failures. A memory channel failure is located and corrected, or alternatively up to c chip failures are corrected and up to d chip failures are detected in the presence of up to u chips that are marked as suspect. A first stage of decoding is performed that results in recovering an estimate of correctable errors affecting the data or in declaring an uncorrectable error state. When an uncorrectable error state is declared, a second stage of decoding is performed to attempt to correct u erasures and a channel error in M iterations where the channel location is changed in each iteration. A correctable error is declared in response to exactly one of the M iterations being successful.

1 Claim, 12 Drawing Sheets

(56) References Cited

U.S. PATENT DOCUMENTS

| | | |
|---|---|---|
| 6,381,685 B2 | 4/2002 | Dell et al. |
| 6,418,068 B1 | 7/2002 | Raynham |
| 6,442,726 B1 | 8/2002 | Knefel |
| 6,715,116 B2 | 3/2004 | Lester et al. |
| 6,763,444 B2 | 7/2004 | Thomann |
| 6,820,072 B1 | 11/2004 | Skaanning et al. |
| 6,845,472 B2 | 1/2005 | Walker et al. |
| 6,845,474 B2 | 1/2005 | Walker et al. |
| 6,854,070 B2 | 2/2005 | Johnson et al. |
| 6,973,612 B1 | 12/2005 | Rodi |
| 6,976,194 B2 * | 12/2005 | Cypher .......... 714/711 |
| 6,981,205 B2 * | 12/2005 | Fukushima et al. ......... 714/797 |
| 6,988,219 B2 | 1/2006 | Hitz et al. |
| 7,055,054 B2 | 5/2006 | Olarig |
| 7,099,994 B2 | 8/2006 | Thayer et al. |
| 7,149,269 B2 | 12/2006 | Cranford, Jr. et al. |
| 7,149,945 B2 | 12/2006 | Brueggen |
| 7,191,257 B2 | 3/2007 | Ali Khan et al. |
| 7,200,780 B2 | 4/2007 | Kushida |
| 7,278,086 B2 * | 10/2007 | Banks et al. .......... 714/784 |
| 7,313,749 B2 * | 12/2007 | Nerl et al. ........ 714/764 |
| 7,320,086 B2 | 1/2008 | Majni et al. |
| 7,353,316 B2 | 4/2008 | Erdmann |
| 7,409,581 B2 | 8/2008 | Santeler et al. |
| 7,467,126 B2 | 12/2008 | Smith et al. |
| 7,484,138 B2 | 1/2009 | Hsieh et al. |
| 7,752,490 B2 | 7/2010 | Abe |
| 8,041,990 B2 | 10/2011 | O'Connor et al. |
| 8,046,628 B2 | 10/2011 | Resnick |
| 2002/0181633 A1 | 12/2002 | Trans |
| 2003/0002358 A1 | 1/2003 | Lee et al. |
| 2003/0023930 A1 | 1/2003 | Fujiwara et al. |
| 2003/0208704 A1 | 11/2003 | Bartels et al. |
| 2004/0034818 A1 | 2/2004 | Gross et al. |
| 2004/0093472 A1 | 5/2004 | Dahlen et al. |
| 2004/0123223 A1 | 6/2004 | Halford |
| 2004/0168101 A1 | 8/2004 | Kubo |
| 2004/0227946 A1 | 11/2004 | Li et al. |
| 2005/0108594 A1 | 5/2005 | Menon et al. |
| 2005/0204264 A1 | 9/2005 | Yusa |
| 2006/0156190 A1 | 7/2006 | Finkelstein et al. |
| 2006/0244827 A1 | 11/2006 | Moya |
| 2006/0248406 A1 | 11/2006 | Qing et al. |
| 2006/0282745 A1 | 12/2006 | Joseph et al. |
| 2007/0011562 A1 | 1/2007 | Alexander et al. |
| 2007/0033195 A1 | 2/2007 | Stange et al. |
| 2007/0047344 A1 | 3/2007 | Thayer et al. |
| 2007/0050688 A1 | 3/2007 | Thayer |
| 2007/0089035 A1 | 4/2007 | Alexander et al. |
| 2007/0101094 A1 | 5/2007 | Thayer et al. |
| 2007/0150792 A1 | 6/2007 | Ruckerbauer |
| 2007/0192667 A1 | 8/2007 | Nieto et al. |
| 2007/0201595 A1 | 8/2007 | Stimple et al. |
| 2007/0217559 A1 | 9/2007 | Stott et al. |
| 2007/0260623 A1 | 11/2007 | Jaquette et al. |
| 2007/0286199 A1 | 12/2007 | Coteus et al. |
| 2008/0005644 A1 | 1/2008 | Dell |
| 2008/0010435 A1 | 1/2008 | Smith et al. |
| 2008/0046796 A1 | 2/2008 | Dell et al. |
| 2008/0163385 A1 | 7/2008 | Mahmoud |
| 2008/0168329 A1 | 7/2008 | Han |
| 2008/0222449 A1 | 9/2008 | Ramgarajan et al. |
| 2008/0250270 A1 | 10/2008 | Bennett |
| 2008/0266999 A1 | 10/2008 | Thayer |
| 2008/0285449 A1 | 11/2008 | Larsson et al. |
| 2008/0313241 A1 | 12/2008 | Li et al. |
| 2009/0006886 A1 | 1/2009 | O'Connor |
| 2009/0006900 A1 | 1/2009 | Lastras-Montano |
| 2009/0024902 A1 | 1/2009 | Jo et al. |
| 2009/0049365 A1 | 2/2009 | Kim et al. |
| 2009/0164715 A1 | 6/2009 | Astigarraga et al. |
| 2009/0193315 A1 | 7/2009 | Gower et al. |
| 2009/0228648 A1 | 9/2009 | Wack |
| 2009/0287890 A1 | 11/2009 | Bolosky |
| 2010/0005281 A1 | 1/2010 | Buchmann et al. |
| 2010/0005345 A1 | 1/2010 | Ferraiolo et al. |
| 2010/0107148 A1 | 4/2010 | Decker et al. |
| 2010/0205367 A1 | 8/2010 | Ehrlich et al. |
| 2010/0241899 A1 | 9/2010 | Mayer et al. |
| 2010/0293532 A1 | 11/2010 | Andrade et al. |
| 2010/0306489 A1 | 12/2010 | Abts et al. |
| 2011/0051854 A1 | 3/2011 | Kizer et al. |
| 2011/0075782 A1 | 3/2011 | Zhang et al. |
| 2011/0078496 A1 | 3/2011 | Jeddeloh |
| 2011/0126079 A1 | 5/2011 | Wu et al. |
| 2011/0173162 A1 | 7/2011 | Anderson et al. |
| 2011/0320869 A1 | 12/2011 | Gower et al. |
| 2011/0320914 A1 | 12/2011 | Alves et al. |

OTHER PUBLICATIONS

L.A. Lastras-Montano; "A new class of array codes for memory storage"; Version—Jan. 19, 2011.

System Z GF (65536) x8 RAIM Code—Mar. 12, 2010, pp. 1-22.

The RAIDBook—A Source Book for RAID Technology by the RAID Advisory Board; Lino Lakes; MN; Jun. 9, 1993; XP002928115.

Chen, P. M., et al.; "RAID: High Performance, Reliable Secondary Storage"; ACM Computing Surveys; ACM, New York, NY, US vol. 26, No. 2, Jun. 1, 1994, pp. 145-185.

EP Application No. 08760760.2 Examination Report dated Jun. 10, 2010, 7 pages.

EP Application No. 08760760.2 Examination Report dated Jul. 23, 2012, 7 pages.

International Search Report and Written Opinion for PCT/EP2008/057199 dated Mar. 23, 2009, 10 pages.

International Search Report and Written Opinion for PCT/EP2011/058924 dated Nov. 9, 2011, 9 pages.

\* cited by examiner

| MARKING STATE | CHIP MARK X | CHIP MARK Y | CHANNEL MARK |
|---|---|---|---|
| A | | | |
| B | ✓ | | |
| C | ✓ | ✓ | |
| D | | | ✓ |
| E | ✓ | | ✓ |
| F | ✓ | ✓ | ✓ |

*FIG. 2*

| MARKING STATE | CHIP MARK X | CHIP MARK Y | CHANNEL MARK | NO NEW ERROR | NEW SINGLE BIT ERROR | NEW DOUBLE BIT ERROR (SEPARATE CHIPS) | NEW SINGLE CHIP ERROR (NOT SINGLE BIT) | NEW DOUBLE ERROR (NOT DOUBLE BIT) | NEW CHANNEL ERROR |
|---|---|---|---|---|---|---|---|---|---|
| A |   |   |   | CLEAN | CE | UE | CE | UE | CE(*) |
| B | ✓ |   |   | CLEAN | CE | UE | CE | UE | CE(*) |
| C | ✓ | ✓ |   | CLEAN | CE | UE | CE | UE | CE(*) |
| D |   |   | ✓ | CLEAN | CE | UE | CE | UE | UE(**) |
| E | ✓ |   | ✓ | CLEAN | CE | UE | UE | UE | UE(**) |
| F | ✓ | ✓ | ✓ | CLEAN | CE | UE | UE | UE() | UE() |

FIG. 3

| MARKING STATE | CHIP MARK X | CHIP MARK Y | CHANNEL MARK | NO NEW ERROR | NEW SINGLE BIT ERROR CHANNELS {0-3}/4 | NEW SINGLE CHIP ERROR (NOT SINGLE BIT) CHANNELS {0-3}/4 |
|---|---|---|---|---|---|---|
| A | | | | SPUE | UE/SPUE | UE/SPUE |
| B | ✓ | | | SPUE | UE/SPUE | UE/SPUE |
| C | ✓ | ✓ | | SPUE | UE/SPUE | UE/SPUE |
| D | | | ✓ | SPUE | UE | UE |
| E | ✓ | | ✓ | SPUE | UE | UE |
| F | ✓ | ✓ | ✓ | SPUE | UE | UE(*) |

FIG. 4

| VALID LOCATION | NEW VALUE FOR $e_x$ | NEW VALUE FOR $e_y$ |
|---|---|---|
| $r \leftarrow r$ | $e_x \leftarrow e_x$ | $e_y \leftarrow e_y$ |
| $r \leftarrow r \oplus x_{(-i*)}$ | $e_x \leftarrow e_x \oplus x_{(-i*)}$ | $e_y \leftarrow e_y$ |
| $r \leftarrow r \oplus y_{(-i*)}$ | $e_x \leftarrow e_x$ | $e_y \leftarrow e_y \oplus y_{(-i*)}$ |
| $r \leftarrow r \oplus x_{(-i*)} \oplus y_{(-i*)}$ | $e_x \leftarrow e_x \oplus x_{(-i*)}$ | $e_y \leftarrow e_y \oplus y_{(-i*)}$ |

TABLE IV

*FIG. 7*

| CHANNEL (k) | CHIP (j) | $X_{k,j}(b_0 b_1 ... b_{15})$ | CHECK (●) DATA (○) |
|---|---|---|---|
| 0 | 0 | 1000000000000000 | ● |
| 0 | 1 | 1000001011000011 | ○ |
| 0 | 2 | 1000110010101111 | ○ |
| 0 | 3 | 1000001111110001 | ○ |
| 0 | 4 | 1000110110010011 | ○ |
| 0 | 5 | 1000101001000101 | ○ |
| 0 | 6 | 1000010100011111 | ○ |
| 0 | 7 | 1000111001101000 | ○ |
| 0 | 8 | 1000011111010001 | ○ |
| 1 | 0 | 0100000000000000 | ● |
| 1 | 1 | 0100000101101101 | ○ |
| 1 | 2 | 0100011001011011 | ○ |
| 1 | 3 | 0100110110111100 | ○ |
| 1 | 4 | 0100101010001101 | ○ |
| 1 | 5 | 0100010100101110 | ○ |
| 1 | 6 | 0100111011001011 | ○ |
| 1 | 7 | 0100011100110100 | ○ |
| 1 | 8 | 0100111110101100 | ○ |
| 2 | 0 | 0010000000000000 | ● |
| 2 | 1 | 0010110000111010 | ○ |
| 2 | 2 | 0010001111101001 | ○ |
| 2 | 3 | 0010101010010110 | ○ |
| 2 | 4 | 0010010101001010 | ○ |
| 2 | 5 | 0010111000010111 | ○ |
| 2 | 6 | 0010011101101001 | ○ |
| 2 | 7 | 0010111111010010 | ○ |
| 2 | 8 | 0010101101010110 | ○ |
| 3 | 0 | 0001000000000000 | ● |
| 3 | 1 | 0001011011010101 | ○ |
| 3 | 2 | 0001110101111000 | ○ |
| 3 | 3 | 0001010110000011 | ○ |
| 3 | 4 | 0001111000100101 | ○ |
| 3 | 5 | 0001011111001111 | ○ |
| 3 | 6 | 0001111100111000 | ○ |
| 3 | 7 | 0001101110100001 | ○ |
| 3 | 8 | 0001100111100011 | ○ |
| 4 | 0 | 1111000000000000 | ● |
| 4 | 1 | 1111100101000001 | ● |
| 4 | 2 | 1111010001100101 | ● |
| 4 | 3 | 1111000101011000 | ● |
| 4 | 4 | 1111110001110001 | ● |
| 4 | 5 | 1111011010110011 | ● |
| 4 | 6 | 1111001110000101 | ● |
| 4 | 7 | 1111110100101111 | ● |
| 4 | 8 | 1111101011001000 | ● |

TABLE V

| CHANNEL 0 | CHANNEL 1 | CHANNEL 2 | ... | CHANNEL M-1 |
|---|---|---|---|---|
| $d_0^{(0)}$ | $d_0^{(1)}$ | $d_0^{(2)}$ | ... | $d_0^{(M-1)}$ |
| $d_1^{(0)}$ | $d_1^{(1)}$ | $d_1^{(2)}$ | ... | $d_1^{(M-1)}$ |
| $d_2^{(0)}$ | $d_2^{(1)}$ | $d_2^{(2)}$ | ... | $d_2^{(M-1)}$ |
| ... | ... | ... | ... | ... |
| $d_{N-1}^{(0)}$ | $d_{N-1}^{(1)}$ | $d_{N-1}^{(2)}$ | ... | $d_{N-1}^{(M-1)}$ |

*FIG. 10*

$$\widehat{H} = \begin{pmatrix} x_{0,0} & \cdots & x_{N-1,0} & x_{0,1} & \cdots & x_{N-1,1} & \cdots & x_{0,M-1} & \cdots & x_{N-1,M-1} \\ x_{0,0}^2 & \cdots & x_{N-1,0}^2 & x_{0,1}^2 & \cdots & x_{N-1,1}^2 & \cdots & x_{0,M-1}^2 & \cdots & x_{N-1,M-1}^2 \\ \cdots & & & & & & & & & \cdots \\ x_{0,0}^{2^{\Delta-1}} & \cdots & x_{N-1,0}^{2^{\Delta-1}} & x_{0,1}^{2^{\Delta-1}} & \cdots & x_{N-1,1}^{2^{\Delta-1}} & \cdots & x_{0,M-1}^{2^{\Delta-1}} & \cdots & x_{N-1,M-1}^{2^{\Delta-1}} \end{pmatrix}$$

OBTAIN $H^{(-0)}$ (ASSOCIATED WITH CHANNEL 0 FAILURE) ⇒

$$\widehat{H}^{(-0)} = \begin{pmatrix} x_{0,1} - x_{0,0} & \cdots & x_{N-1,1} - x_{N-1,0} & \cdots & x_{0,M-1} - x_{0,0} & \cdots & x_{N-1,M-1} - x_{N-1,0} \\ (x_{0,1} - x_{0,0})^2 & \cdots & (x_{N-1,1} - x_{N-1,0})^2 & \cdots & (x_{0,M-1} - x_{0,0})^2 & \cdots & (x_{N-1,M-1} - x_{N-1,0})^2 \\ \cdots & & & & & & \cdots \\ (x_{0,1} - x_{0,0})^{2^{\Delta-1}} & \cdots & (x_{N-1,1} - x_{N-1,0})^{2^{\Delta-1}} & \cdots & (x_{0,M-1} - x_{0,0})^{2^{\Delta-1}} & \cdots & (x_{N-1,M-1} - x_{N-1,0})^{2^{\Delta-1}} \end{pmatrix}$$

PERFORM BINARY EXPANSION OF FIRST ROW OF $\widehat{H}^{(-0)}$ ⇒

$$B^{(-0)} = \begin{pmatrix} [x_{0,1} - x_{0,0}]_0 & \cdots & [x_{N-1,1} - x_{N-1,0}]_0 & \cdots & [x_{0,M-1} - x_{0,0}]_0 & \cdots & [x_{N-1,M-1} - x_{N-1,0}]_0 \\ [x_{0,1} - x_{0,0}]_1 & \cdots & [x_{N-1,1} - x_{N-1,0}]_1 & \cdots & [x_{0,M-1} - x_{0,0}]_1 & \cdots & [x_{N-1,M-1} - x_{N-1,0}]_1 \\ \cdots & & & & & & \cdots \\ [x_{0,1} - x_{0,0}]_{b-1} & \cdots & [x_{N-1,1} - x_{N-1,0}]_{b-1} & \cdots & [x_{0,M-1} - x_{0,0}]_{b-1} & \cdots & [x_{N-1,M-1} - x_{N-1,0}]_{b-1} \end{pmatrix}$$

*FIG. 12*

CORRECTING MEMORY DEVICE AND MEMORY CHANNEL FAILURES IN THE PRESENCE OF KNOWN MEMORY DEVICE FAILURES

BACKGROUND

This invention relates generally to computer memory and more particularly, to error detection and correction in a redundant memory system.

Memory device densities have continued to grow as computer systems have become more powerful. With the increase in density comes an increased probability of encountering a memory failure during normal system operations. Techniques to detect and correct bit errors have evolved into an elaborate science over the past several decades. Perhaps the most basic detection technique is the generation of odd or even parity where the number of 1's or 0's in a data word are "exclusive or-ed" (XOR-ed) together to produce a parity bit. If there is a single error present in the data word during a read operation, it can be detected by regenerating parity from the data and then checking to see that it matches the stored (originally generated) parity.

Richard Hamming recognized that the parity technique could be extended to not only detect errors, but to also correct errors by appending an XOR field, an error correction code (ECC) field, to each data, or code, word. The ECC field is a combination of different bits in the word XOR-ed together so that some number of errors can be detected, pinpointed, and corrected. The number of errors that can be detected, pinpointed, and corrected is related to the length of the ECC field appended to the data word. ECC techniques have been used to improve availability of storage systems by correcting memory device (e.g., dynamic random access memory or "DRAM") failures so that customers do not experience data loss or data integrity issues due to failure of a memory device.

Redundant array of independent memory (RAIM) systems have been developed to improve performance and/or to increase the availability of storage systems. RAIM distributes data across several independent memory modules (each memory module contains one or more memory devices). There are many different RAIM schemes that have been developed each having different characteristics, and different pros and cons associated with them. Performance, availability, and utilization/efficiency (the percentage of the disks that actually hold customer data) are perhaps the most important. The tradeoffs associated with various schemes have to be carefully considered because improvements in one attribute can often result in reductions in another.

BRIEF SUMMARY

An embodiment is method for locating and correcting a memory channel failure, or alternately for correcting up to c chip failures and detecting up to d chip failures in the presence of up to u chips that are marked as suspect. The method includes computing syndromes of data retrieved from a memory in a memory system comprising M channels. A first stage of decoding is performed using a decoder capable of u-erasure, c error correction, and d error detection. Performing the first stage of decoding results in recovering an estimate of correctable errors affecting the data or in declaring an uncorrectable error state. An uncorrectable error state is declared in response to a syndrome of the recovered estimated errors not being the same as the computed syndromes of data retrieved from the memory. A second stage of decoding is performed in response to the uncorrectable error state being declared. The performing a second stage includes attempting to correct u erasures and a channel error in M iterations, while changing a channel location in each iteration. A correctable error is declared in response to exactly one of the M iterations being successful.

BRIEF DESCRIPTION OF THE SEVERAL VIEWS OF THE DRAWINGS

Referring now to the drawings wherein like elements are numbered alike in the several FIGURES:

FIG. 2 depicts a table that defines the marking states for a RAIM code in accordance with an embodiment;

FIG. 3 depicts a table that summarizes the capabilities of the RAIM code in accordance with an embodiment;

FIG. 4 depicts a table that summarizes the capabilities of the RAIM code in the presence of an injected SPUE in accordance with an embodiment;

FIG. 7 depicts a table that summaries updates that need to be performed to various variables according an exemplary embodiments;

FIG. 8 depicts a table that includes a binary pattern corresponding to each symbol in an embodiment of the RAIM code;

FIG. 9 depicts an error control code symbol definition according to an embodiment;

FIG. 10 depicts an array of symbols in an error control code in accordance with an embodiment;

FIG. 12 depicts an embodiment of a binary code being derived from a parity check matrix.

DETAILED DESCRIPTION

An embodiment provides an implementation efficient error control coding system that allows a memory to sustain a combination of known memory device failures, a channel failure, as well as additional corrections. An embodiment of an algorithm described herein is able to detect and correct a failing channel even in the presence of known chip failures without any external aid to locate the failing channel. An embodiment provides a general framework for the design of a new class of efficient coding algorithms that may be applied to a variety of memory system architectures. An embodiment described herein provides lower complexity of implementation, a more regular placement for redundant checks throughout a channel, and no loss of strength in error correction and detection coverage as compared to Reed-Solomon codes.

As in many redundant array of independent memory (RAIM) system designs, an embodiment assumes that one channel stores the simple parity of the other channels, thus enabling a simple way of correcting for many errors. Embodiments described herein are concerned with the check bits that are stored in the other channels and how to design these check bits. In an embodiment, these check bits are designed to solve the problem of "error mirroring" which is the phenomenon that errors outsides a failing channel get replicated into the failing channel when a simple "exclusive or" (XOR) operation is used to correct the failing channel, thus increasing the apparent number of errors in the pattern.

An embodiment described herein provides techniques for developing parity check matrices, as well as very efficient encoding and decoding algorithms for codes that have no loss of strength with respect to Reed-Solomon codes, yet preserve the simple parity across the channels and gracefully handle the problem of error mirroring.

As used herein, the term "memory channel" refers to a logical entity that is attached to a memory controller and which connects and communicates to registers, memory buffers and memory devices. Thus, for example, in a cascaded memory module configuration a memory channel would comprise the connection means from a memory controller to a first memory module, the connection means from the first memory module to a second memory module, and all intermediate memory buffers, etc. As used herein, the term "channel failure" refers to any event that can result in corrupted data appearing in the interface of a memory controller to the memory channel. This failure could be, for example, in a communication bus (e.g., electrical, and optical) or in a device that is used as an intermediate medium for buffering data to be conveyed from memory devices through a communication bus, such as a memory hub device.

Figure 1:
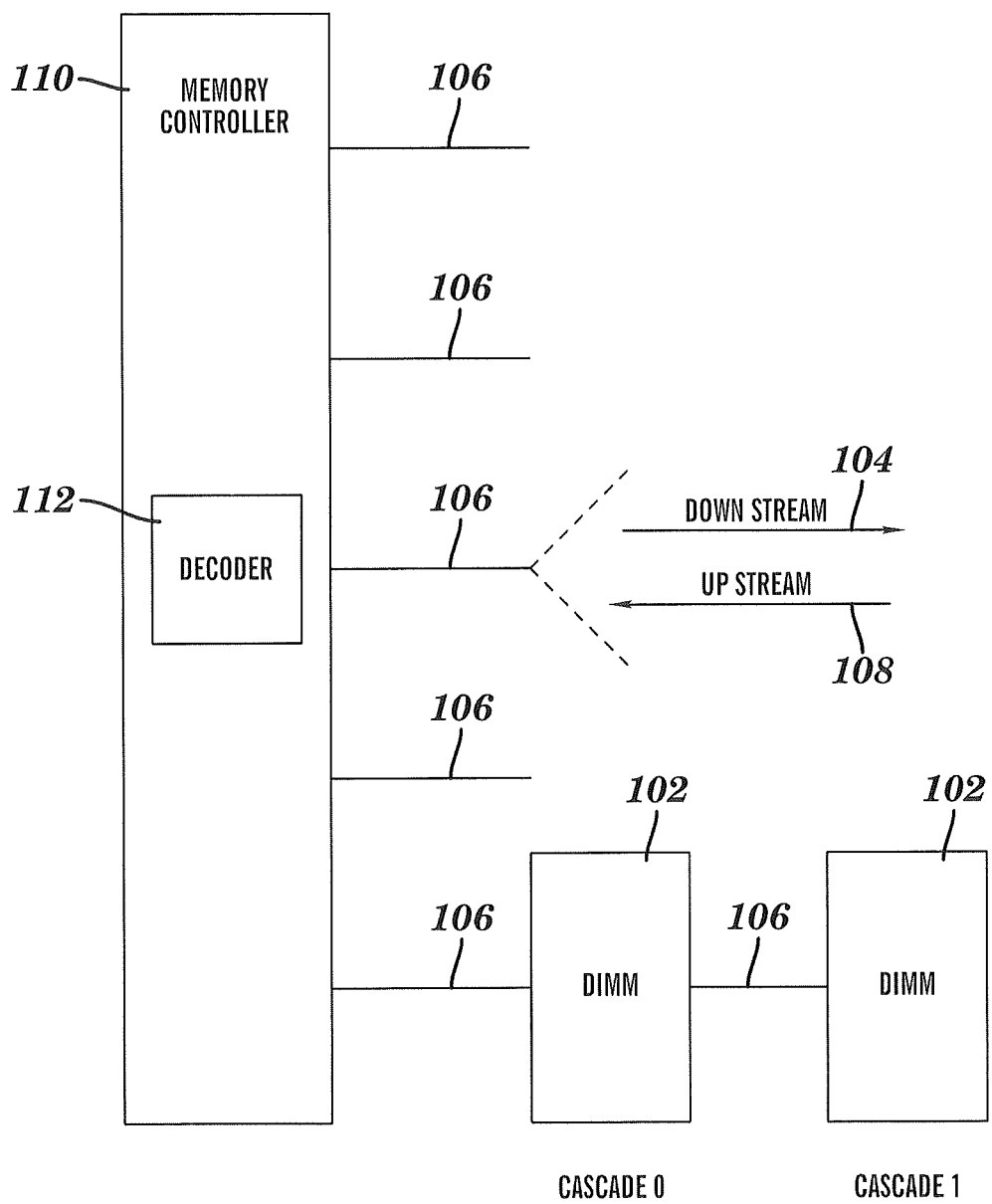
FIG. 1 is a block diagram of a cascaded interconnect memory system that may be implemented by an exemplary embodiment.

FIG. 1 is a block diagram of a cascade interconnect memory system that may be implemented by an exemplary embodiment. The memory system depicted in FIG. 1 includes multiple independent cascade interconnected memory interface busses 106 that are logically aggregated together to operate in unison to support a single independent access request from a memory controller 110. The servicing of the single independent access request includes data and error detection/correction information distributed or "striped" across the parallel memory interface busses 106 and associated memory devices located on the memory modules 102.

As shown in the embodiment depicted in FIG. 1, the memory controller 110 attaches to five narrow/high speed point-to-point memory interface busses 106, with each memory interface bus 106 connecting one of five memory controller interface channels to a cascade interconnect memory module 102 (or memory subsystem). In an exemplary embodiment, each memory module 102 includes at least one hub device and one or more memory devices. As used herein, the terms "memory device" and "chip" are used interchangeably with a chip being a particular implementation of a memory device. As depicted in FIG. 1, the memory interface busses 106 operate in unison to support an access request from the memory controller 110. In an exemplary embodiment, there may exist a multiplicity of outstanding fetch and store requests to the multiple cascades in the memory subsystem.

Each memory interface bus 106 in the embodiment depicted in FIG. 1 includes an upstream bus 108 and a downstream bus 104. One of the functions provided by the memory modules 102 (e.g., a hub device located on the memory module 102) is a re-drive function to send signals on the upstream bus 108 to the memory controller 110 or on the downstream bus 104 to other memory modules 102. In an exemplary embodiment, up to two memory modules 102 are cascade connected to each memory interface bus 106. In an exemplary embodiment, the memory interface bus 106 is implemented using differential clock and data signals (i.e., each clock and data signal requires two wires). In an exemplary embodiment, the downstream bus 104 includes thirty-two wires to support: one clock signal, thirteen data/command signals (or bits), one spare clock lane, and one spare data/command lane. In this embodiment, each data packet is transferred over the downstream bus 104 in twelve beats. In an exemplary embodiment, the upstream bus 108 includes forty-six wires to support: one clock signal, twenty data/command signals, one spare clock lane, and one spare data/command lane. In this embodiment, each data packet is transferred over the upstream bus 108 in eight beats.

As used herein, the term "RAIM" refers to redundant arrays of independent memory modules (e.g., dual in-line memory modules or "DIMMs). In a RAIM system, if one of the memory channels fails (e.g, a memory module in the channel), the redundancy allows the memory system to use data from one or more of the other memory channels to reconstruct the data stored on the memory module(s) in the failing channel. The reconstruction is also referred to as error correction. As used herein, the terms "RAIM" and "redundant arrays of independent disk" or "RAID" are used interchangeably.

In an exemplary embodiment, the memory system depicted in FIG. 1 is a RAIM memory system and the five channels are lock step channels (i.e., the five memory interface busses 106 are accessed in unison with each other). In an exemplary embodiment, the RAIM system depicted in FIG. 1 is implemented using the RAIM ECC code described herein which has the property that one of the channel's data is the bitwise XOR of the other four channel's data with additional check bits included in order to correct for additional errors. In the embodiment depicted in FIG. 1, the decoder 112 is located on the memory controller 110. In embodiments, the decoder 112 is located on the memory modules 102, the memory controller and/or on other hardware/software locations in the memory system.

As used herein, the term "mark" refers to is an indication given to an ECC that a particular symbol or set of symbols of a read word are suspected to be faulty. The ECC can then use this information to enhance its error correction properties. As used herein, the term "correctable error" or "CE" refers to an error that can be corrected while the system is operational, and thus a CE does not cause a system outage. As used herein, the term "uncorrectable error" or "UE" refers to an error that cannot be corrected while the memory system is operational, and thus correction of a UE causes the memory system to be off-line for some period of time while the cause of the UE is being corrected (e.g., by replacing a memory device, by replacing a memory module, recalibrating and interface).

As used herein, the term "coincident" refers to the occurrence of two (or more) error patterns or error conditions that overlap each other in time. In one example, a CE occurs and then later in time, before the first CE can be repaired, a second failure occurs. The first and second failure are said to be coincident. Repair times are always greater than zero and the longer the repair time, the more likely it would be to have a second failure occur coincident with a the first. Some contemporary systems attempt to handle multiple failing devices by requiring sparing a first device or module. This may require substantially longer repair times than simply using marking, as provided by exemplary embodiments described herein. Before a second failure is identified, exemplary embodiments provide for immediate correction of a memory channel failure using marking, thus allowing an additional correction of a second failure. Once a memory channel failure is identified, an exemplary embodiment provides correction of the memory channel failure, up to two marked additional chips (e.g., memory devices) and a new single bit error. If the system has at most one marked memory device together with the marked channel, then an entire new chip error can be corrected.

The words "memory channel failure" utilized herein, includes failures of the communication medium that conveys the data from the memory modules 102 to the memory controller 110 (i.e., a memory interface bus 106), in addition to possible memory hub devices and registers.

The ECC code described herein supports incorporating a special uncorrectable error (SPUE) signature into an encoded data packet so that in the absence of new errors, and irrespective of the chip and channel marking state and the errors in the marked chips/channel, the SPUE is still detectable as a SPUE. Even if there are a large number of errors on top of the codeword, the data will still be flagged as a UE. This is necessary to protect against UE data that has to be stored to memory to keep soft errors from having that data appear good (i.e. Clean or CE).

FIG. 2 depicts a table that defines the marking states for a RAIM code according to the value of the chip marks (x and y) as well as the channel mark in accordance with an embodiment. A checkmark indicates that the associated mark has a non-default valid value (i.e., the mark is pointing to a chip/channel). The absence of a checkmark indicates that the corresponding mark is pointing to its default value.

FIG. 3 depicts a table that summarizes the capabilities of an embodiment of the RAIM code as a function of the marking state. A '(*)' indicates that the channel error is correctable in all but about 1 $e^{-9}$ of the cases. A '(**)' indicates that the UE flag is raised with extremely high probability.

FIG. 4 depicts a table that summarizes the capabilities of an embodiment of the RAIM code in the presence of an injected SPUE. A '(*)' indicates that the UE flag is raised with extremely high probability.

A description of a decoder implemented in accordance with an embodiment follows.

Regular Syndrome Generation Stage.

There two distinct kinds of syndromes that are associated with an embodiment of a code. One is called the Z syndrome which is obtained by doing a simple XOR of the contents of the five channels:

$$Z = D_0 \oplus D_1 \oplus D_2 \oplus D_3 \oplus D_4$$

The other syndrome is called S, and is associated with a parity check matrix:

$$H = [H_0 H_1 H_2 H_3 H_4]:$$

$$S = H_0 D_0 \oplus H_1 D_1 \oplus H_2 D_2 \oplus H_3 D_3 \oplus H_4 D_4$$

This parity check matrix is highly structured and thus the computation of S admits efficient implementations, as described herein below. In an embodiment, the quantity S is a total of 64 bits, logically grouped in four 16-bit ($2^{16}$) Galois Field (GF) elements.

Channel Adjusted Syndrome Generation Stage.

In an embodiment, the decoder initially computes five syndromes $\{S^{(-0)}, S^{(-1)}, S^{(-2)}, S^{(-3)}, S^{(-4)}\}$ called the "channel adjusted syndromes". Mathematically, $S^{(-i)}$ are the syndromes that would be obtained if the contents of channel i were replaced with the XOR of the contents of the other four channels. The original syndrome S is 64 bits, and the same is true for $S^{(-i)}$, $i \in \{0, 1, 2, 3, 4\}$. Since the contents of the ith channel are $D_i$ and $Z = D_0 \oplus D_1 \oplus D_2 \oplus D_3 \oplus D_4$, the adjusted content for $D_i$ can be computed as $D_i \oplus Z$.

Thus, mathematically, the definition of an embodiment of $S^{(-i)}$ is as follows:

$$S^{(-i)} = H_0 D_0 \oplus H_1 D_1 \oplus H_2 D_2 \oplus H_3 D_3 \oplus H_4 D_4 \oplus H_i Z$$
$$= S \oplus H_i Z$$

It is important to note that channel adjusted syndromes are computed for all channels i∈{0, 1, 2, 3, 4}. A primary reason behind the design of an embodiment is to be able to have a total latency for the decoder that is constant across all possible error pattern instances. In particular, in this manner the decoder is prepared to correct any possible unknown channel failure.

Chip and Channel Adjusted Syndrome Generation Stage.

In an embodiment, this stage is responsible for removing from each of the syndromes computed in the earlier stage the contribution of any possible error that is residing in chip pointed to by x or y. The input signals to the RAIM block x and y (henceforth called the "chip marks") are each in one of two valid generic states: a chip mark can be set to a default location (different for x and y), or can point to a valid chip location. It is allowed for one chip mark to point to its default location and the other one to be pointing to a valid chip location. The default locations are logically thought to be in a sixth (physically non-existing) channel and in chip positions 9 and 10 of the sixth channel, again these locations physically non-existing depicts since in an embodiment a channel has exactly 9 chips associated with it.

Figure 5:
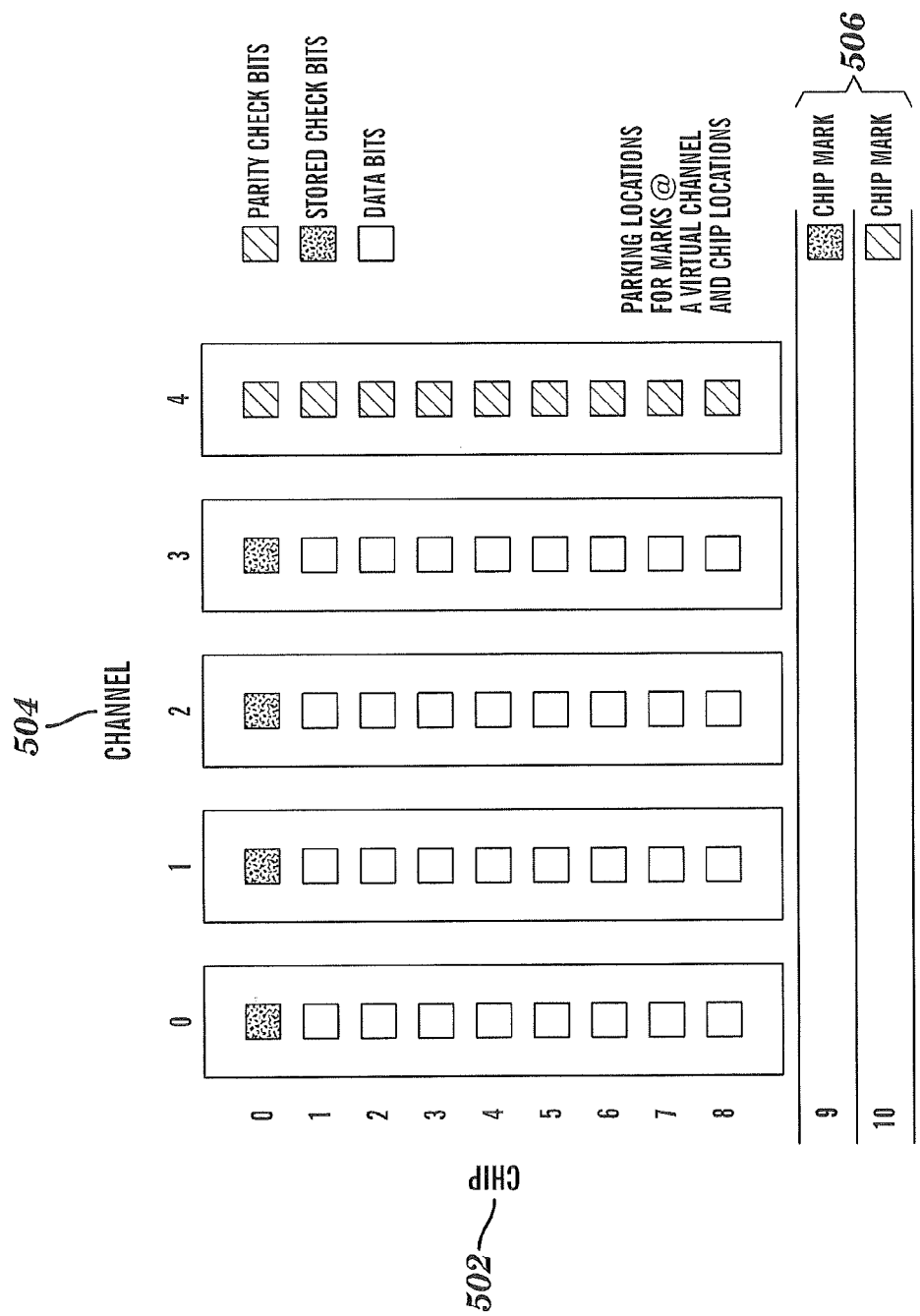
FIG. 5 illustrates an embodiment of the logical placement of symbols of an ECC code.

FIG. 5 illustrates an embodiment of the logical placement of symbols of an error control code in a memory system that includes five channels 504 (e.g., each channel corresponding to a memory module 102) and nine chips 502 (e.g., memory devices). As shown in FIG. 5, four of the channels 504 include stored check bits (e.g., nine sixteen bit symbols) and the fifth channel is the RAIM channel that contains a simple XOR of the other four channels. Also shown in FIG. 5 are the two chip marks 506 which are logically assigned to a sixth (non-existing) channel on non-existing chips nine and ten.

In an embodiment, the decoder is completely symmetric in x and y; that is, it is not necessary to use specifically x or y when there is only one chip being marked. The chip marks may also be thought of as "soft" (unlike the case of chip sparing) since there is no actual data movement/changes when a chip mark is placed, these marks may be removed or changed to another chip with a simple mark store table update (in an embodiment the mark store table is not a component that belongs to the RAIM block). In an embodiment, the decoder always removes any contribution of errors in chips pointed to by x and y even if x and/or y are pointing to a default "parked" location.

The notation used herein is as follows: $\hat{S}^{(-i)}$ denotes the chip and channel adjusted syndromes for the case in which channel i is thought to contain the channel error, and these syndromes are derived from the syndromes $S^{(-i)}$. For each i∈{0, 1, 2, 3, 4}, $S^{(-i)}$ contains exactly four 16-bit GF($2^{16}$) quantities (same number of bits as in S), whereas the chip and channel adjusted syndromes $\{\hat{S}^{(-i)}\}$ are each only two 16-bit quantities. This is explained by the fact that an embodiment always removes potential errors for exactly two chip locations, even if one or two of these locations are pointing to their default value.

An important special case happens when x or y or both happen to point at chip(s) that reside on the same channel that is being adjusted for. The design is such that it is necessary to avoid "double marking" chip locations. Thus, in an embodiment, the following procedure is performed by the decoder: while preparing the chip and channel adjusted syndromes for channel i, it is checked whether x, y or both reside on channel i. Any chip mark pointing to a chip in channel i is "moved" to its default location for the purposes of making computations that assume that channel i is marked. It is important to note that the "movement" of chip marks is independent for each channel; all five possible chip mark movements are calculated and performed in parallel.

One embodiment of this design is that the corrected content of chips that are marked may in fact be corrected through the RAIM channel correction mechanism.

Channel Adjusted Mark Generation.

In an embodiment, the externally supplied chip marks x, y need to be suitably modified for each possible choice for channel mark. One reason has been mentioned previously: when a chip mark points to a chip that is contained in a channel that is being marked, this chip mark needs to be moved to its default position. This is not the only reason the chip marks need to be adjusted in a per channel marked basis. The structure of an embodiment of the this RAIM code, which stores a simple parity in the fifth channel of the other four channels, gives rise to a phenomenon that is termed "error mirroring".

This is most easily understood by example. Suppose that the following is received from the five channels:

$$\left( D_0, D_1 \begin{bmatrix} 0 \\ 0 \\ 0 \\ 0 \\ e \\ 0 \\ 0 \\ 0 \\ 0 \end{bmatrix}, D_2, D_3 \oplus \begin{bmatrix} \epsilon_1 \\ \epsilon_2 \\ \epsilon_3 \\ \epsilon_4 \\ \epsilon_5 \\ \epsilon_6 \\ \epsilon_7 \\ \epsilon_8 \\ \epsilon_9 \end{bmatrix}, D_4 \right)$$

In the above, $D_i$ stands for the original nine 16-bit symbols stored in channel i for $i \in \{0, 1, 2, 3, 4\}$ (so that $D_4 = D_0 \oplus D_1 \oplus D_2 \oplus D_3$), there is a single chip error in channel one in the fifth chip with an error magnitude e and there is a channel failure in channel three. If channel three is marked accordingly, consider what would be obtained if XOR of channels 0, 1, 2 and 4 is calculated and the result is substituted in channel three:

$$\left( D_0, D_1 \begin{bmatrix} 0 \\ 0 \\ 0 \\ 0 \\ e \\ 0 \\ 0 \\ 0 \\ 0 \end{bmatrix}, D_2, D_3 \oplus \begin{bmatrix} 0 \\ 0 \\ 0 \\ 0 \\ e \\ 0 \\ 0 \\ 0 \\ 0 \end{bmatrix}, D_4 \right)$$

Note that the chip error with magnitude e has been "mirrored" into channel three, in exactly the same row (chip index within a channel) as the original row (row five in this case). An exemplary embodiment of the decoder Due to reasons that are beyond the scope of this initial high level description of the decoder operation it turns out that the correct method for decoding the remaining error calls for thinking of "channel adjusted chip positions" instead of regular chip positions, and thus chip marks need to be channel adjusted for each channel. Suppose that $X_{k,j}$ is the 16-bit Galois Field pattern that is associated with the chip in channel k, chip j. Then the channel adjusted chip position of $X_{k,j}$ when channel i* is marked is given by $X_{k,j} \oplus X_{i^*,j}$.

Syndrome and Mark Selector.

The architecture of an embodiment of the decoder is such that internally, a channel is always chosen to be marked. The index of this channel that is marked is called i*, which is a number in $\{0, 1, 2, 3, 4\}$. This is true even in the case there are no new errors to be solved for or in the case there is no external channel marked. When there is no obvious choice for what channel mark to use, the decoder chooses the fifth channel (i*=4) as the channel mark.

An embodiment of a process followed to do syndrome selection is described next. When an external channel mark is given, the decoder will always multiplex the chip and channel adjusted syndromes corresponding to that channel (it will also multiplex the channel adjusted syndromes for that channel as well, as they are needed for the next stage).

When there is no external channel mark placed, the decoder checks whether there is a unique chip and channel adjusted syndrome that is exactly equal to zero, since such "signature" implies that applying that channel mark in conjunction with potential existing chip marks, would fully resolve the error. If a unique choice exists, the syndrome selection circuitry chooses to select such syndrome, which of course by definition is equal to zero. It also selects the corresponding channel adjusted syndrome, which is general non-zero.

If all the chip and channel adjusted syndromes are equal to zero:

$$\hat{S}^{(-0)} = \hat{S}^{(-1)} = \hat{S}^{(-2)} = \hat{S}^{(-3)} = \hat{S}^{(-4)} = 0$$

then, the decoder at this moment has learned that no new error has taken place, beyond any error potentially present in chips that are marked. In this case, the syndromes corresponding to the fifth channel (both channel adjusted and chip and channel adjusted) are selected as a default action.

The final case is when there are at least two distinct channels i, j with $$\hat{S}^{(-i)} = \hat{S}^{(-j)} = 0$$

In this case, the decoder does not have enough information to decide which is the failing channel and declares an uncorrectable error.

Syndrome Decoder.

In an embodiment, once a choice for what chip and channel adjusted syndromes to employ has been made, the decoder proceeds to decode the resulting syndromes. Throughout this discussion the terminology "error magnitude" will refer to the bit flip masks that need to be applied to a chip in order to correct its error.

It is important to note that this stage of the decoder processes both the channel adjusted syndromes as well as the chip and channel adjusted syndromes. The latter are analyzed first when attempting to find the location and magnitude of a potential new chip error, and the former are then employed when computing the error magnitudes of the chips that are marked.

If the chip and channel adjusted syndrome is zero, no further errors have been detected and hence all that remains is to compute the error magnitudes associated with the channel marked and the chips marked.

If the chip and channel adjusted syndrome is nonzero, this implies that there is an error that must be analyzed to see whether is correctable, and if so, to correct it. In an embodiment this includes two steps. The first step is the computation of the error magnitude e and location r of a potential new chip error. A salient feature of this step is that the location computation procedure entails solving a quartic that due to its special structure, admits a simplified implementation. The quartic does result in four possible solutions for r, but the mathematical properties of the code are such that when there is a new single chip error, it is guaranteed that only one of the four possible solutions will correspond to a valid chip location. The decoder compares the roots of the quartic against the possible valid chip locations and eliminates from the list those roots that are not valid. The second step is the computation of the error magnitudes $e_x$ and $e_y$ of the chips pointed to by x and y. The outcome of this step is self explanatory. It is important to note though that both $e_x$ and $e_y$ are computed even if x, or y or both are pointing to their default location. If x is pointing to its default location, then $e_x=0$ in the absence of uncorrectable errors; similarly for y.

Bit Flip Mask Generation and Flags Generation.

In an embodiment, this is the last stage of decoding. This stage requires access to $e_x$, $e_y$, e and r, as well as the syndrome Z, among other findings of the decoder. In principle, the following prescription results in the desired correction: the bit flip masks $e_x$, $e_y$ and e are applied to the chips pointed to x, y and r, respectively, unless the chip pointed to is not a valid chip location (for example, a default value for x is not a valid chip location for x). Then the contents of the channel i* are replaced with the XOR of the chip corrected contents of the other 4 channels. It is important to note that in an embodiment, the values of x and y must correspond.

An actual implementation of an embodiment in the decoder may achieve the above in a different manner, because the decoder needs to generate an overall bit flip mask for the data in all five channels that is then applied to the data as a single last step. In an embodiment, the bit flip mask is generated as follows. As in the description above, the values of $e_x$, $e_y$, e and x, y, and r are used to generate the bit flip mask corresponding to "chip corrections"; note that this is one mask for each of the 4 channels that are not marked (equivalently, that are not assigned the index i*). Then, each of the masks for the 4 channels is applied to the Z syndrome that is forwarded to this stage from the initial syndrome generation stage. The result of this operation becomes the bit flip mask of the channel that is marked (i*).

Also in this section the decoder computes the uncorrectable error flag. There are various invalid conditions that the decoder checks for in order to form an overall uncorrectable error flag; it is important to note that it is important to capture all possible invalid states for the decoder in order to obtain the maximum amount of protection against potential mis-corrections.

A particular UE condition that is worth singling out due to its special significance relates to the claim in the last two columns of the table in FIG. 3 for state F. Note that the table indicates that single bit errors are correctable whereas double bit errors are fully detectable. Disallowing corrections of new errors in state F that have 2 or more bits in error in one 16-bit symbol, results in any double bit error always be detected. This property is obtained by a very careful choice of the "chip indexing" function that is described in a later section of this document, and has been proved to be true by an exhaustive computer manipulation of the parity check matrix of the code.

No External Channel Mark.

In this case, an embodiment of the decoder is responsible for correcting up to two chip marks, and an unknown chip error or channel error. An important consideration is the decoder, in this mode, internally treats unknown chip errors as channel errors, and corrects them accordingly. In this setting, the syndromes obtained in the "syndrome selection" stage described above are equal to zero, and therefore the circuits under "syndrome decoder" that look for new errors do not find any. This design stems from the fact that the decoder does not make a distinction on the number of errors present in a channel when it detects a channel error.

External Channel Mark Specified.

In contrast to the no external channel mark situation, in this mode new chip errors result in a nonzero chip and channel adjusted syndrome selected in the "syndrome and mark selector". Thus, new errors are resolved using the "syndrome decoder" stage. This remark together with the previous one implies that the mechanisms for correcting new single chip errors differ according to whether there is an external channel mark or not.

Figure 6:
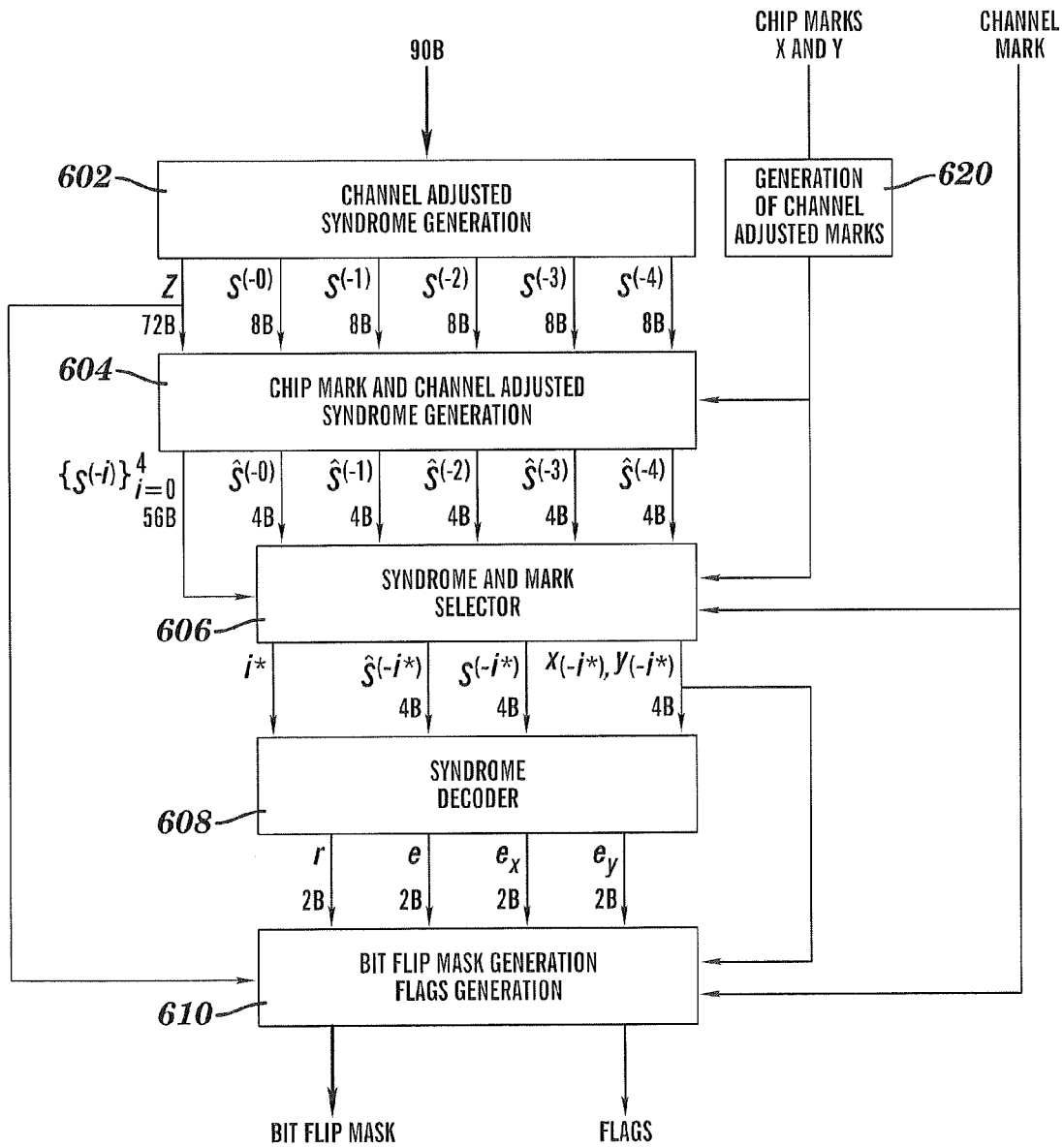
FIG. 6 depicts a process flow of a decoder in accordance with an embodiment.

FIG. 6 depicts a summary of the process flow described above and implemented by an embodiment of the decoder. In an embodiment that utilizes a double data rate three (DDR3) device, a sixteen bit symbol is received over two transfers. In an embodiment, the RAIM code is applied four times across the burst of 8 in each DRAM, each processing 64 bytes (B) worth of data for a total of 256B. Input to the process includes data from the 5 channels, the chip marks and the channel mark. At block 602, channel adjusted syndrome generation is performed and at block 620 channel adjust marks are generated. At block 604, chip mark and channel adjust syndrome generation is performed, and at block 606, syndrome and mark selection are performed. At block 608, syndrome decoding is performed and at block 610, bit flip masks and flags are generated and output.

The following section describes Galois field arithmetic that is implemented by an embodiment. In an embodiment: GF(16) elements are polynomials of degree less than 4 in the variable u, where operations are done modulo $1+u+u^4$; GF(256) elements are polynomials of degree less than 2 in the variable v, with operations done modulo $1+u^3+v+v^2$; and GF(65536) elements are polynomials of degree less than 2 in the variable z, with operations done modulo $(u^2+u^3)v+z+z^2$. As described herein, the convention followed is that the bit pattern $b_0 b_1 \ldots b_{14} b_{15}$, which is ordered in agreement with the manner in which VHDL ("very high speed integrated circuit hardware description language") orders bits denotes the GF(65536) element:

$$[(b_0+b_1 u+b_2 u^2+b_3 u^3)+(b_4+b_5 u+b_6 u^2+b_7 u^3)v]+[(b_8+b_9 u+b_{10} u^2+b_{11} u^3)+(b_{12}+b_{13} u+b_{14} u^2+b_{15} u^3)v]z$$

The construction of the GF(65536) field is such that it is natural to think of one such element as four elements of GF(16) concatenated. With this in mind, introduced is the convention that the GF(65536) symbol $(a_0+a_1 v)+(a_2+a_3 v)z$ where $a_0, a_1, a_2, a_3$ are GF(16) elements may also be written as the vector:

$$\begin{bmatrix} a_0 \\ a_1 \\ a_2 \\ a_3 \end{bmatrix}$$

Thus for example within this convention:

$$\begin{bmatrix} \gamma \\ 0 \\ 0 \\ 0 \end{bmatrix} \begin{bmatrix} a_0 \\ a_1 \\ a_2 \\ a_3 \end{bmatrix} = \begin{bmatrix} \gamma a_0 \\ \gamma a_1 \\ \gamma a_2 \\ \gamma a_3 \end{bmatrix}$$

where $\gamma$ is a GF(16) element.

Following is a description of the symbols associated with each chip location in an embodiment. The GF($2^{16}$) symbol associated with channel $k \in \{0, 1, 2, 3, 4\}$, chip index $j \in \{1, 2, 3, 4, 5, 6, 7, 8\}$ is given by:

$$X_{k,j} = \beta_k \begin{bmatrix} 1 \\ u^{I(j)} \\ u^{2I(j)} \\ u^{3I(j)} \end{bmatrix}$$

where I(j) is the indexing function that sets I(1, 2, . . . , 8, 9, 10)={2, 4, 6, 7, 8, 9, 10, 11, 12, 13}, and the $\beta_i$ are GF(16) elements given by:

$\beta_0 = 1$
$\beta_1 = u$
$\beta_2 = u^2$
$\beta_3 = u^3$
$\beta_4 = 1 + u + u^2 + u^3$
$\beta_5 = 1 + u$ In an embodiment, the checks are stored in locations $X_{0,0}, \ldots X_{4,0}$ which in turn is defined as $$X_{k,0} = \begin{bmatrix} \beta_k \\ 0 \\ 0 \\ 0 \end{bmatrix}$$

for $k \in \{0, 1, 2, 3, 4\}$. The two default symbols for the x and y marks are given by:

$$X_{def} = \beta_5 \cdot \begin{bmatrix} 1 \\ u^{I(9)} \\ u^{2I(9)} \\ u^{3I(9)} \end{bmatrix}$$

$$Y_{def} = \beta_5 \begin{bmatrix} 1 \\ u^{I(10)} \\ u^{2I(10)} \\ u^{3I(10)} \end{bmatrix}$$

The role of the indexing function I(•) is to enable the single bit correct/double bit detect feature when a channel is marked and two chips are marked.

Following is a description of an embodiment of the parity check matrix along with key properties. The parity check matrix is $H = [H_0\ H_1\ H_2\ H_3\ H_4]$ where $H_i$ for $i \in \{0, 1, 2, 3, 4\}$ is given by:

$$H_i \begin{bmatrix} X_{i,0} & X_{i,1} & \ldots & X_{i,8} \\ X_{i,0}^2 & X_{i,1}^2 & \ldots & X_{i,8}^2 \\ X_{i,0}^4 & X_{i,1}^4 & \ldots & X_{i,8}^4 \\ X_{i,0}^8 & X_{i,1}^8 & \ldots & X_{i,8}^8 \end{bmatrix}$$

The following auxiliary matrices are defined:

$H^{(-0)} = [H_1 \oplus H_0\ H_2 \oplus H_0\ H_3 \oplus H_0\ H_4 \oplus H_0]$ $H^{(-1)} = [H_0 \oplus H_1\ H_2 \oplus H_1\ H_3 \oplus H_1\ H_4 \oplus H_1]$ $H^{(-2)} = [H_0 \oplus H_2\ H_1 \oplus H_2\ H_3 \oplus H_2\ H_4 \oplus H_2]$ $H^{(-3)} = [H_0 \oplus H_3\ H_1 \oplus H_3\ H_2 \oplus H_3\ H_4 \oplus H_3]$ $H^{(-4)} = [H_0 \oplus H_4\ H_1 \oplus H_4\ H_2 \oplus H_4\ H_3 \oplus H_4]$ The following is the basic result for this code, which essentially ensures that the "error mirroring" effect caused by correcting a failed channel does not result on a reduced error correction and correction degradation with respect to having used a fully maximum-distance separable (MDS) code.

Theorem 1. Each of the matrices $H^{(-i)}$ for $i \in \{0, 1, 2, 3, 4\}$ is MDS over GF($2^{16}$), this is, the 4×4 matrix with entries from GF($2^{16}$) formed by selecting any four columns is invertible.

As a matter of fact, a stronger and useful result holds. Let $$A = \begin{bmatrix} X_{SPUE} & X_{def,(-i^*)} & Y_{def,(-i^*)} \\ X_{SPUE}^2 & (X_{def,(-i^*)})^2 & (Y_{def,(-i^*)})^2 \\ X_{SPUE}^4 & (X_{def,(-i^*)})^4 & (Y_{def,(-i^*)})^4 \\ X_{SPUE}^8 & (X_{def,(-i^*)})^8 & (Y_{def,(-i^*)})^8 \end{bmatrix}$$

Then the following holds:

Result 1. Each of the matrices $[H^{(-i)}\ A]$ for $i \in \{0, 1, 2, 3, 4\}$ is MDS over GF($2^{16}$), that is, the 4×4 matrix with entries from GF($2^{16}$) formed by selecting any four columns is invertible. This result is of importance to obtain various desired properties for the error control code when default marks and SPUE are involved. The proof of Theorem 1 is based on purely algebraic arguments. The proof of Result 1, is via an exhaustive computer checking.

Following is a description of an embodiment of the decoder.

The following computes the regular syndromes of the code:

$Z = D_0 \oplus D_1 \oplus D_2 \oplus D_3 \oplus D_4$ $S = H_0 D_0 \oplus H_1 D_1 \oplus H_2 D_2 \oplus H_3 D_3 \oplus H_4 D_4$ Due to the manner in which the parity check matrix is defined, the indexing of the vector S follows the following convention:

$$S = \begin{bmatrix} S_1 \\ S_2 \\ S_4 \\ S_8 \end{bmatrix}$$

The following computes the syndromes for each possible channel mark:

$S^{(-i)} = S \oplus H_i Z\ i \in \{0,1,2,3,4\}$

The two chip marks are x,y. Adjusted for channel mark i, the chip marks are $x_{(-i)}$ and $y_{(-i)}$; see below for an example embodiment of how to compute the adjusted marks.

The following computes the syndromes that incorporate the 2 chip marks for each possible channel mark:

$$\hat{S}_1^{(-i)} = (x_{(-i)}y_{(-i)}^2 \oplus x_{(-i)}^2 y_{(-i)})S_1^{(-i)} \oplus (x_{(-i)}y_{(-i)} \oplus x_{(-i)}^2 \oplus y_{(-i)}^2)S_2^{(-i)} \oplus S_4^{(-i)} \ i \in \{0,1,2,3,4\}$$

$$\hat{S}_2^{(-i)} = (x_{(-i)}^2 y_{(-i)}^4 \oplus x_{(-i)}^4 y_{(-i)}^2)S_2^{(-i)} \oplus (x_{(-i)}^2 y_{(-i)}^2 \oplus x_{(-i)}^4 \oplus y_{(-i)}^4)S_4^{(-i)} \oplus S_8^{(-i)} \ i \in \{0,1,2,3,4\} \quad (1)$$

The following computes the flag that determines whether a given channel mark solves the error equations:

$$F_i = (\hat{S}_1^{(-i)} == 0) \&\& (\hat{S}_2^{(-i)} == 0) \ i \in \{0,1,2,3,4\}$$

The value of i* is then determined as follows:

If an external channel mark has been passed to the decoder, then set i* to be the value of that external channel mark.

If no external channel mark has been passed then, if exactly one of the $F_i$ flags is true, i* is assigned to the corresponding index. If no external channel mark has been passed and none of the $F_i$ flags are true (or two or more are true), then set i*=4 (a default value).

The error magnitude for a possible new error is computed with:

$$e = \frac{(\hat{S}_1^{(-i^*)})^2}{\hat{S}_2^{(-i^*)}}$$

The error location is found as follows. First compute:

$$\alpha = \frac{\hat{S}_2^{(-i^*)}}{\hat{S}_1^{(-i^*)}}$$

Conceptually, first it is required to find a value of r that satisfies the quartic equation:

$$r^4 \oplus r^2(x_{(-i^*)}y_{(-i^*)} \oplus x_{(-i^*)} \oplus y_{(-i^*)}^2) \oplus r(x_{(-i^*)}y_{(-i^*)}^2 \oplus x_{(-i^*)}^2 y_{(-i^*)}) \oplus \alpha = 0$$

It is possible that there is no such solution, in which case an uncorrectable error condition has been identified. The error magnitudes for the erased locations can be found from:

$$e_x = \frac{y_{(-i^*)}(S_2^{(-i^*)} \oplus r^2 e) \oplus y_{(-i^*)}^2(S_1^{(-i^*)} \oplus re)}{x_{(-i^*)}y_{(-i^*)}^2 \oplus x_{(-i^*)}^2 y_{(-i^*)}}$$

$$e_y = \frac{x_{(-i^*)}(S_2^{(-i^*)} \oplus r^2 e) \oplus x_{(-i^*)}^2(S_1^{(-i^*)} \oplus re)}{x_{(-i^*)}y_{(-i^*)}^2 \oplus x_{(-i^*)}^2 y_{(-i^*)}}$$

In an embodiment, an algebraic method is utilized for solving the quartic. This method also allows a computation of the associated error magnitudes $e_x$, $e_y$ in a manner synergistic to the solution of the quartic. First compute:

$$d_x = \frac{1}{x_{(-i^*)}(y_{(-i^*)} \oplus x_{(-i^*)})}$$

$$d_y = \frac{1}{y_{(-i^*)}(y_{(-i^*)} \oplus x_{(-i^*)})}$$

Next, obtain $w_x$, $w_y$ as solutions for the quadratics $$w_x^2 + w_x + \alpha d_x^2 = 0$$

$$w_y^2 + w_y + \alpha d_y^2 = 0$$

through the module $w_x$=quadroot($\alpha d_x^2$), $w_y$=quadroot($\alpha d_y^2$). Then use $w_x$, $w_y$ to compute r, $e_x$ and $e_y$ with the following equations:

$$e_x = d_x(S_2^{(-i^*)} \oplus y_{(-i^*)}S_1^{(-i^*)}) \oplus ew_x$$

$$e_y = d_y(S_2^{(-i^*)} \oplus x_{(-i^*)}S_1^{(-i^*)}) \oplus ew_y$$

$$r = x_{(-i^*)}w_x \oplus y_{(-i^*)}w_y$$

Next there are two broad cases:

d(r=0). This happens if and only if $\alpha$=0. In this case, both $e_x$ and $e_y$ have the correct error magnitude for the marked chip position (the marks possibly being default). Also it will be true that e=0.

d(r≠0). This happens if and only if $\alpha$≠0 and therefore e≠0. In this case we need to test which of the following expressions is a valid location:

$$r, r \oplus x_{(-i^*)}, r \oplus y_{(-i^*)}, r \oplus x_{(-i^*)} \oplus y_{(-i^*)}$$

The valid locations are given by the chip locations adjusted for channel i* AND the $X_{SPUE}$ location (without any adjustment whatsoever), for a total of N(M−1)+1 locations. The code is constructed so that when a new chip error is present, or when $X_{SPUE}$ is injected in the absence of a new error, exactly one of the expressions above will be valid.

If it is determined that exactly one of the expressions is valid, then r is added the appropriate term (either $x_{(-i^*)}$, or $y_{(-i^*)}$, or $x_{(-i^*)} \oplus y_{(-i^*)}$). If it is needed to add $x_{(-i^*)}$ to r, then set $e_x \leftarrow e_x \oplus e$. If it is needed to add $y_{(-i^*)}$ to r, then set $e_y \leftarrow e_y \oplus e$. These actions are summarized below in a chart that summarizes the updates to r, $e_x$ and $e_y$ that need to be performed according to which solution to the quartic is found to be a valid solution:

| Valid location | New value for $e_x$ | New value for $e_y$ |
| --- | --- | --- |
| r←r | $e_x \leftarrow e_x$ | $e_y \leftarrow e_y$ |
| r←r⊕$x_{(-i^*)}$ | $e_x \leftarrow e_x \oplus x_{(-i^*)}$ | $e_y \leftarrow e_y$ |
| r←r⊕$y_{(-i^*)}$ | $e_x \leftarrow e_x$ | $e_y \leftarrow e_y \oplus y_{(-i^*)}$ |
| r←r⊕$x_{(-i^*)}$⊕$y_{(-i^*)}$ | $e_x \leftarrow e_x \oplus x_{(-i^*)}$ | $e_y \leftarrow e_y \oplus y_{(-i^*)}$ |

Finally, it is needed to trap some uncorrectable error situations. These are summarized as follows: the quartic has no solutions whatsoever; the quartic does not have exactly one valid solution; and the valid solution to the quartic is equal to $X_{SPUE}$. If any of the situations above hold, then the uncorrectable error flag is raised. One embodiment for doing this, which is described herein, is to set, r←0 if any of the above holds. Because in this case e≠0, the $UE_3$ condition described below will ensure that these will be caught as uncorrectable errors.

After the processing of these two broad cases, the process continues with the computation of the UE flag, as well as the potential bit flipping correction stage. Recall that if it is the case that $\beta_x$=i* then the x was moved to $X_{def}$ for the purposes of computing $x_{(-i^*)}$. When computing the UE flag it is required to use "moved" x mark as well. An identical statement holds true for the y mark. To this end, let $$\hat{x} = \begin{cases} x & \beta_x \neq \beta_{i^*} \quad (2) \\ X_{def} & \beta_x = \beta_{i^*} \quad (3) \end{cases}$$

$$\hat{y} = \begin{cases} y & \beta_y \neq \beta_{i^*} \quad (5) \\ Y_{def} & \beta_y = \beta_{i^*} \quad (6) \end{cases}$$

The global UE flag is computed by joining together several partial UE flags. In an embodiment, these conditions include:

0. The syndromes adjusted for channel i* and the chip marks must either be both zero or both nonzero. $UE_0 = (\hat{S}_1^{(-i^*)} == 0) \oplus (\hat{S}_2^{(i^*)} == 0)$
1. If there is no external channel mark, then the $\{F_i\}_i$ flags must report either that exactly one channel can resolve the problem or that all channels can resolve the problem. Thus, letting count denote the number of flags $F_i$ that are true, $UE_1 = (\text{passed\_external\_channel\_mark} == \text{FALSE}) \&\& (\text{count} \neq 1) \&\& (\text{count} \neq 5)$
2. This computes the UE's flag contribution coming from correcting the erasures. Note the use of $\hat{x}$ and $\hat{y}$ instead of x, y, respectively. $UE_2 = ((\hat{x} == X_{def}) \&\& (e_x! = 0)) || ((\hat{y} == Y_{def}) \&\& (e_y! = 0))$ This flag is used also in the computation of the SPUE flag.
3. This computes the UE's flag contribution coming the various exception cases when processing the solution to the quartic.

$UE_3 = ((r == 0) \&\& (e \neq 0));$
4. This computes the UE flag that ensures the single bit correct/double bit detect with a channel mark. Let weight(e) denote the number of bits set to one (out of the 16 bits).

$UE_4 = ((\text{weight}(e) > 1) \&\& (\hat{x} \neq X_{def}) \&\& (\hat{y} \neq Y_{def}))$
5. This flag is important to ensure that a channel failure when there is no channel marked never mis-corrects. The reason this condition is needed is because some channel failures have the property that all of the 5 $F_i$ flags turn out to be true. oxUE$_5$ is set to be true if all the following hold: there is no external channel mark; all of the 5 $F_i$ flags are true; and there are corrections outside of non-default chip marks.

The complete UE flag can then be computed using:

$UE = UE_0 || UE_1 || UE_2 || UE_3 || UE_4 || UE_5$

In an embodiment, the correction is performed by letting $D_{i^*} \leftarrow D_{i^*} \oplus Z$ and then applying the corrections ($e_x$, $e_y$, e) to both locations mirroring the errors.

Following is a description of an embodiment of a method for adjusting the marks to reflect a channel mark. It is assumed that the channel being marked is denoted by the index $i \in \{0, 1, 2, 3, 4\}$ The method for adjusting the marks for x and y is described by $$x_{(-i)} = \begin{cases} \left(\frac{\beta_x + \beta_i}{\beta_x}\right)x & \beta_x \neq \beta_i \\ \left(\frac{\beta_5 + \beta_i}{\beta_5}\right)X_{def} & \beta_x = \beta_i \end{cases}$$

$$y_{(-i)} = \begin{cases} \left(\frac{\beta_y + \beta_i}{\beta_y}\right)y & \beta_y \neq \beta_i \\ \left(\frac{\beta_5 + \beta_i}{\beta_5}\right)Y_{def} & \beta_y = \beta_i \end{cases}$$

Following is an analysis of uncorrectable channel failures in an embodiment. With a small probability, this code is unable to correct for an unmarked channel failure. This section analyzes the precise conditions in which this happens. An unmarked channel failure is uncorrectable when it is the case that there is a subset $A \in \{0, 1, 2, 3, 4\}$, such the number of elements in A is two or greater and furthermore we have that for $i \in A$, $(\hat{S}_1^{(-i)} == 0) \&\& (\hat{S}_2^{(-i)} == 0)$ Pick any two distinct i, $j \in A$ A. The case of no chips marked. In the case there are no chips marked, and by letting E to be the channel failure error vector, and $g \in \{0, 1, 2, 3, 4\}$ the index of the failing channel, results in $Z = E$ and $S = H_g E$ so that for every $i \in \{0, 1, 2, 3, 4\}$, $S^{(-i)} = (H_g \oplus H_i)E$ The code construction is such that for every $i \in \{0, 1, 2, 3, 4\}$, $H_i = B_i H_0$, where $B_i$ the diagonal matrix given by $$B_i = \begin{bmatrix} \beta_i & 0 & 0 & 0 \\ 0 & \beta_i^2 & 0 & 0 \\ 0 & 0 & \beta_i^4 & 0 \\ 0 & 0 & 0 & \beta_i^8 \end{bmatrix}$$

From this, it can easily identify a class of errors that are uncorrectable. Write $S^{(-i)} = (H_g - H_i)E = (B_g \oplus B_i)H_0 E$ and consider the class of errors $U = \{E : H_0 E = 0\}$. Clearly, it can be shown that for $E \in U$, for every $i \in \{0, 1, 2, 3, 4\}$, $S^{(-i)} = 0$ and therefore $\hat{S}_1^{(-i)} = \hat{S}_2^{(-i)} = 0$, showing that this class of errors is uncorrectable.

More generally it can be seen that $\hat{S}_1^{(-i)} = \hat{S}_2^{(-i)} = 0$ if and only if there exists $\psi_1, \psi_2$ such that equation (4) below holds:

$$\begin{bmatrix} X_{def} & Y_{def} \\ X_{def}^2 & Y_{def}^2 \\ X_{def}^4 & Y_{def}^4 \\ X_{def}^8 & Y_{def}^8 \end{bmatrix} \begin{bmatrix} \psi_1 \\ \psi_2 \end{bmatrix} = (B_g \oplus B_i)H_0 E$$

Note that for all distinct $i, j \in \{0, 1, 2, 3, 4\}$, $\beta_i \neq \beta_j$ and therefore $B_i \oplus B_j$ is an invertible matrix. Thus $(B_g \oplus B_i)H_0$ has full rank, and for fixed $\psi_1, \psi_2$ there are multiple choices for E that will solve this equation. By then varying $\psi_1, \psi_2$, the set of all possible errors E that are uncorrectable can be obtained.

The special case described earlier corresponds to the class of uncorrectable errors that can be found by setting $\psi_1 = \psi_2 = 0$.

The following text described special uncorrectable errors (SPUEs).

Analysis: Adding an SPUE at encoding time.

The overall parity check of the RAIM code is given by the (N+r)×(MN) matrix:

$$H = \begin{bmatrix} I_N & I_N & I_N & I_N & I_N \\ H_0 & H_1 & H_2 & H_3 & H_4 \end{bmatrix} \quad (3)$$

where N=9, r=4, $I_N$ represents the N×N identity matrix, and $H_{i*}$ represents the r×N section of the parity check matrix that contributions to the formation of the bottom r syndromes for the data and checks in the ith channel.

The general method for incorporating an SPUE is based on an augmented version of (3), given by:

$$H_{aug} = \begin{bmatrix} I_N & I_N & I_N & I_N & I_N & 0 \\ & & & & & X_{SPUE} \\ H_0 & H_1 & H_2 & H_3 & H_4 & X_{SPUE}^2 \\ & & & & & X_{SPUE}^4 \\ & & & & & X_{SPUE}^8 \end{bmatrix}$$

where the precise definition of $X_{SPUE}$ will be given in the subsequent discussion. Given the channel data vectors $\{D_i\}_{i=0}^{M-2}$ each of which has N−1=8 entries in GF($2^{16}$) when the encoder wishes to store this data with an SPUE mark, it chooses the checks $c_0$, $c_1$, $c_2$, $c_3$ (each of which is a single entry in GF($2^{16}$)) so as to satisfy the equation $$H_{aug} \begin{bmatrix} c_0 \\ D_0 \\ c_1 \\ D_1 \\ c_2 \\ D_2 \\ c_3 \\ D_3 \\ c_0 \oplus c_1 \oplus c_2 \oplus c_3 \\ D_0 \oplus D_1 \oplus D_2 \oplus D_3 \\ 1 \end{bmatrix} = 0 \quad (4)$$

This can be done as follows. Let $\hat{c}_0, \hat{c}_1, \hat{c}_2, \hat{c}_3$ and $\tilde{c}_0, \tilde{c}_1, \tilde{c}_2, \tilde{c}_3$ satisfy the following equations:

$$H_{aug} \begin{bmatrix} \hat{c}_0 \\ 0 \\ \hat{c}_1 \\ 0 \\ \hat{c}_2 \\ 0 \\ \hat{c}_3 \\ 0 \\ \hat{c}_0 \oplus \hat{c}_1 \oplus \hat{c}_2 \oplus \hat{c}_3 \\ 0 \\ 1 \end{bmatrix} = 0,$$

$$H_{aug} \begin{bmatrix} \tilde{c}_0 \\ D_0 \\ \tilde{c}_1 \\ D_1 \\ \tilde{c}_2 \\ D_2 \\ \tilde{c}_3 \\ D_3 \\ \tilde{c}_0 \oplus \tilde{c}_1 \oplus \tilde{c}_2 \oplus \tilde{c}_3 \\ D_0 \oplus D_1 \oplus D_2 \oplus D_3 \\ 0 \end{bmatrix} = 0$$

By defining $c_i = \hat{c}_i \oplus \tilde{c}_i$ for i∈{0, 1, 2, 3} and summing the two equations above (sum=⊕), equation (4) is obtained, as desired. Now recall that the first column of $H_i$ (which is associated with the check symbol for channel i) is equal to $$\begin{bmatrix} \beta_i \\ \beta_i^2 \\ \beta_i^4 \\ \beta_i^8 \end{bmatrix}$$

Therefore, in an embodiment, to compute $\hat{c}_0, \hat{c}_1, \hat{c}_2, \hat{c}_3$ the following equation needs to be solved:

$$\begin{bmatrix} \beta_0 \oplus \beta_4 & \beta_1 \oplus \beta_4 & \beta_2 \oplus \beta_4 & \beta_3 \oplus \beta_4 \\ \beta_0^2 \oplus \beta_4^2 & \beta_1^2 \oplus \beta_4^2 & \beta_2^2 \oplus \beta_4^2 & \beta_3^2 \oplus \beta_4^2 \\ \beta_0^4 \oplus \beta_4^4 & \beta_1^4 \oplus \beta_4^4 & \beta_2^4 \oplus \beta_4^4 & \beta_3^4 \oplus \beta_4^4 \\ \beta_0^8 \oplus \beta_4^8 & \beta_1^8 \oplus \beta_4^8 & \beta_2^8 \oplus \beta_4^8 & \beta_3^8 \oplus \beta_4^8 \end{bmatrix} \begin{bmatrix} \hat{c}_0 \\ \hat{c}_1 \\ \hat{c}_2 \\ \hat{c}_3 \end{bmatrix} = \begin{bmatrix} X_{SPUE} \\ X_{SPUE}^2 \\ X_{SPUE}^4 \\ X_{SPUE}^8 \end{bmatrix} \quad (5)$$

In summary, in order to incorporate an SPUE into the codeword in an embodiment, take the checks $\tilde{c}_0, \tilde{c}_1, \tilde{c}_2, \tilde{c}_3$ from the standard output of the encoder and then XOR these with the checks $\hat{c}_0, \hat{c}_1, \hat{c}_2, \hat{c}_3$ computed from solving equation (5).

Specific values used for SPUE encoding and detection in an embodiment. The following choice for $X_{SPUE}$ passes all the relevant tests for an SPUE described above and it additionally has the property that when a channel is marked and two chips are marked, a single bit error injected and an SPUE is present, the decoder will not mis-correct. Using the bit ordering $b_0 b_1 \ldots b_{15}$, this design chooses $X_{SPUE}$=1000110111010101

$\hat{c}_0$=1011010110110000

$\hat{c}_1$=1001001011101000

$\hat{c}_2$=1111100001100000

$\hat{c}_3$=1000100011111000

$\hat{c}_4$=0101011111000000

Decoder processing of an SPUE with no unmarked errors in an embodiment. The methodology for this section is to follow the decoder processing in order to understand how a 90B chunk of data that has an SPUE is processed. Using the notation from the previous subsection, what the decoder receives is $$A_{recvd} = \begin{bmatrix} c_0 \\ D_0 \\ c_1 \\ D_1 \\ c_2 \\ D_2 \\ c_3 \\ D_3 \\ c_0 \oplus c_1 \oplus c_2 \oplus c_3 \\ D_0 \oplus D_1 \oplus D_2 \oplus D_3 \end{bmatrix} \oplus \Delta$$

where $\Delta$ is a vector with NM entries in $GF(2^{16})$ that represents all of the errors affecting the data received. For this part of the analysis it is not assumed that these errors are necessarily marked or even correctable. Recall also from the previous subsection that $c_i = \tilde{c}_i \oplus \hat{c}_i$.

The first stage of the decoder is to compute Z and S; these quantities are independent of the values of the marks passed to the decoder x and y as well as the value of the external channel mark. These values are given by $$\begin{bmatrix} Z \\ S \end{bmatrix} = HA_{recvd} = H\Delta \oplus \begin{bmatrix} 0 \\ \vdots \\ 0 \\ X_{SPUE} \\ X_{SPUE}^2 \\ X_{SPUE}^4 \\ X_{SPUE}^8 \end{bmatrix}$$

where there are $N_0$ entries in the rightmost vector above. Let $S_{not\ SPUE}$ be the syndromes obtained when exactly the same data is encoded without an SPUE, and when exactly the same errors are present in the data when it is retrieved. Thus $$S_{not\ SPUE} = [H_0 H_1 H_2 H_3 H_4]\Delta$$

Note that the Z syndrome is unaffected by the application of the SPUE mark, and therefore $Z_{not\ SPUE} = Z$. The decoder then computes the channel adjusted syndromes $S^{(-i)}$ for $i \in \{0, 1, 2, 3, 4\}$, using the formula $S^{(-i)} = S \oplus H_i Z$, obtaining:

$$S^{(-i)} = (S_{not\ SPUE} \oplus H_i Z) \oplus \begin{bmatrix} X_{SPUE} \\ X_{SPUE}^2 \\ X_{SPUE}^4 \\ X_{SPUE}^8 \end{bmatrix}$$

$$= S_{not\ SPUE}^{(-i)} \oplus \begin{bmatrix} X_{SPUE} \\ X_{SPUE}^2 \\ X_{SPUE}^4 \\ X_{SPUE}^8 \end{bmatrix}$$

where $S_{not\ SPUE}^{(-i)}$ denotes syndromes adjusted for channel i that would have been received if exactly the same data was encoded without an SPUE and exactly the same errors are present in the data when it is retrieved. The decoder next computes the chip and channel adjusted syndromes according to Equation (1). Note that in order to compute the chip and channel adjusted syndromes for every possible channel marked $i \in \{0, 1, 2, 3, 4\}$, the decoder internally moves any marks that are in a given channel to their default values. The label $x_{(-i)}$ and $y_{(-i)}$ is used to denote the channel adjusted marks that are obtained after the possible movement to their default location. Using the same methodology as before, it can be deduced that $$\hat{S}_1^{(-i)} = \hat{S}_{1,not\ SPUE}^{(-i)} \oplus (x_{(-i)} y_{(-i)}^2 \oplus x_{(-i)}^2 y_{(-i)}) X_{SPUE}$$
$$\oplus (x_{(-i)} y_{(-i)} \oplus x_{(-i)}^2 \oplus y_{(-i)}^2) X_{SPUE}^2 + X_{SPUE}^4$$

$$\hat{S}_2^{(-i)} = \hat{S}_{2,not\ SPUE}^{(-i)} \oplus (x_{(-i)} y_{(-i)}^2 \oplus x_{(-i)}^2 y_{(-i)})^2 X_{SPUE}^2$$
$$\oplus (x_{(-i)} y_{(-i)} \oplus x_{(-i)}^2 \oplus y_{(-i)}^2)^2 X_{SPUE}^4 + X_{SPUE}^8$$

Suppose now that there are no unmarked errors in the data received. It is known that if there was no SPUE encoded in the data the following would hold true $$\hat{S}_{1,not\ SPUE}^{(-i)} = 0$$

$$\hat{S}_{2,not\ SPUE}^{(-i)} = 0$$

and therefore the syndromes $\hat{S}_1^{(-i)}$, $\hat{S}_2^{(-i)}$ satisfy $$\hat{S}_1^{(-i)} = (x_{(-i)} y_{(-i)}^2 \oplus x_{(-i)}^2 y_{(-i)}) X_{SPUE} \oplus (x_{(-i)} y_{(-i)}$$
$$\oplus x_{(-i)}^2 \oplus y_{(-i)}^2) X_{SPUE}^2 + X_{SPUE}^4$$

$$\hat{S}_2^{(-i)} = (x_{(-i)} y_{(-i)}^2 \oplus x_{(-i)}^2 y_{(-i)})^2 X_{SPUE}^2 \oplus (x_{(-i)} y_{(-i)}$$
$$\oplus x_{(-i)}^2 \oplus y_{(-i)}^2)^2 X_{SPUE}^4 + X_{SPUE}^8$$

In an embodiment, the design must ensure that for any $i \in \{0, 1, 2, 3, 4\}$, $\hat{S}_1^{(-i)} \neq 0$, $\hat{S}_2^{(-i)} \neq 0$, so that the decoder is not "tricked" into thinking that there is a correctable error that can be resolved using a channel mark. This leads to a first requirement for how to choose $X_{SPUE}$:

For all $i \in \{0, 1, 2, 3, 4\}$, $x, y \in \{X_{def}, Y_{def}\} \cup \{X_{i,j}\}_{i \in \{0, \ldots, 4\}, j \in \{0, \ldots, 8\}}$ $$0 \neq (x_{(-i)} y_{(-i)}^2 \oplus x_{(-i)}^2 y_{(-i)}) X_{SPUE} \oplus (x_{(-i)} y_{(-i)} \oplus x_{(-i)}^2$$
$$\oplus y_{(-i)}^2) X_{SPUE}^2 + X_{SPUE}^4$$

Assuming this requirement is met (this will be shown later), the decoder then chooses $i^* = 4$ if no external channel mark was passed, or it sets $i^*$ equal to the external channel mark if one is given. The next step of the decoder is to compute $\alpha$ and $e$, which the decoder obtains as:

$$\alpha = \hat{S}_1^{(-i)}$$

$$e = 1$$

The decoder then proceeds to solve the quartic $$r^4 + r^2(x_{(-i)} y_{(-i)} + x_{(-i)}^2 + y_{(-i)}^2) + r(x_{(-i)} y_{(-i)}^2 + x_{(-i)}^2 y_{(-i)}) + \alpha = 0$$

This quartic has the four solutions
$X_{SPUE}$
$X_{SPUE} \oplus x_{(-i^*)}$
$X_{SPUE} \oplus y_{(-i^*)}$
$X_{SPUE} \oplus x_{(-i^*)} \oplus y_{(-i^*)}$ Finally, recall from the decoder operation description that $\hat{x}$ and $\hat{y}$ are the actually employed channel marks (standard, not channel adjusted, see Equation (2). If $\hat{x} = X_{def}$, then even in the presence of an SPUE, we should never see $e_x \neq 0$. Similarly, if $\hat{y} = Y_{def}$, we should never see $e_y \neq 0$.

Summarizing the findings of an embodiment, a SPUE is determined by checking whether i) one of the solutions to the quartic is equal to $X_{SPUE}$; ii) $e=1$; iii) if $\hat{x} = X_{def}$, then $e_x = 0$; iv) If $\hat{y} = Y_{def}$ then $e_y = 0$. If these four conditions are true, then an SPUE is declared.

Note: conditions iii) and iv) above may be implemented ensuring that the SPUE flag is not set whenever $UE_2$ is on.

Analysis showing that correctable errors cannot be converted into SPUE's. It is of significant importance to demonstrate that no correctable error, on whatever combination of chip and channel marks and failures, can possibly be declared an SPUE. This may be in principle possible because when the decoder finds the 4 solutions to the quartic, it may be that one of the solutions is $X_{SPUE}$. It is shown below that this cannot happen by proper choice of $X_{SPUE}$. If a correctable error is such that $S_1^{(-i*)}=S_2^{(-i*)}=0$ (this happens when all errors are marked or when a new error is solved by the RAIM correction machinery), then e=0 and therefore in this case there is never an SPUE declared. So suppose that there is an external channel mark and suppose that a new error has occurred in location l with an error magnitude of 1. Then $$S_1^{(-i*)}=(x_{(-i)}y_{(-i)}^2 \oplus x_{(-i)}^2 y_{(-i)})l_{(-i)} \oplus (x_{(-i)}y_{(-i)} \oplus x_{(-i)}^2 \oplus y_{(-i)}^2)l_{(-i)}^2 + l_{(-i)}^4$$

$$S_2^{(-i*)}=(x_{(-i)}y_{(-i)}^2 \oplus x_{(-i)}^2 y_{(-i)})^2 l_{(-i)}^2 \oplus (x_{(-i)}y_{(-i)} \oplus x_{(-i)}^2 \oplus y_{(-i)}^2)^2 l_{(-i)}^4 + l_{(-i)}^8$$

The decoder, as designed, computes e=1 and $\alpha=\hat{S}_1^{(-i*)}$. It then finds as solutions to the quartic the following quantities:

$l_{(-i)}$
$l_{(-i)} \oplus x_{(-i*)}$
$l_{(-i)} \oplus y_{(-i*)}$
$l_{(-i)} \oplus x_{(-i*)} \oplus y_{(-i*)}$ Now, choose $X_{SPUE}$ so that regardless of the value of $i* \in \{0, 1, 2, 3, 4\}$, and regardless of the value of x, y, l all of which can take on a maximum of N×M+2 values (the l symbol can only take on up to N×M values), none of the four quantities above can be equal to $X_{SPUE}$, then a correctable error will never become an SPUE.

A computer program has been written that tests whether a particular candidate for $X_{SPUE}$ is viable in the sense of the reasoning above. The value of $X_{SPUE}$ given in the this document has been shown to be viable in this manner. Note that this implies that whenever the SPUE flag is raised, the UE flag is raised as well.

Analysis of the probability of raising the SPUE flag when an uncorrectable error is present in an embodiment. Assume that $\hat{S}_1^{(-i*)}$ and $\hat{S}_2^{(-i*)}$ are independent random variables each uniformly distributed over $GF(2^{16})$, $\{0\}$. The vast majority of the values that these variables can take correspond to uncorrectable errors. The question is asked, what is the probability that with such uniformly chosen syndromes one can call the result an SPUE? With this model, the values of e and α that the decoder computes are itself independent random variables each distributed over $GF(2^{16})$, $\{0\}$. With chance approximately $\frac{1}{2}^{16}$ the value that the decoder calculates for e is equal to one, which implies that the probability of converting an uncorrectable error into an SPUE is smaller than $\frac{1}{2}^{16}$. To complete this assessment one needs to compute the probability that when α is chosen at random, one of the solutions of the quartic is equal to $X_{SPUE}$.

Implementation Notes for embodiments described herein.

Computation of the regular syndromes (S) according to an embodiment. The computation of the syndrome S can be simplified by noting that:

$$H_i = B_i H_0$$

$$B_i = \begin{bmatrix} \beta_i & 0 & 0 & 0 \\ 0 & \beta_i^2 & 0 & 0 \\ 0 & 0 & \beta_i^4 & 0 \\ 0 & 0 & 0 & \beta_i^8 \end{bmatrix}$$

and therefore $S_i=[H_0]_i(D_0 \oplus \beta_1^i D_1 \oplus \beta_2^i D_2 \oplus \beta_3^i D_3 \oplus \beta_4^i D_4)$, where $[H_0]_i$ is the ith row of $H_0$, and where $i \in \{1, 2, 4, 8\}$. The nature of the simplification relies on the fact that each of the factors $\beta_i$ are elements of GF(16). If the computation of the syndromes S can be done in two cycles, then the hardware can be reduced by half as follows.

The matrix $H_0$ can be split in 4 sections, each of which has the same number of columns but ¼ of the number of rows:

$$H_0 = \begin{bmatrix} [H_0]_1 \\ [H_0]_2 \\ [H_0]_4 \\ [H_0]_8 \end{bmatrix}$$

The data from the channels $D_0, D_1, D_2, D_3, D_4$ is received from the DRAM interface in two cycles, which allows the $S_1, S_2, S_4, S_8$ syndromes to be computed using approximately half the circuitry than it would be required in a single cycle computation. Let $D_{k,i}$ for $i \in \{0, 1, \ldots, 8\}$ denote the symbol received in channel k for the i th chip, and let $[D_{k,i}]_j$ for $j \in \{0, 1, \ldots, 15\}$ denote the jth bit in symbol $D_{k,i}$. It is assumed that in the first transfer from the DRAM interface, the kth channel presents the bits $[D_{k,0}]_0[D_{k,0}]_1 \ldots [D_{k,0}]_7, [D_{k,1}]_0[D_{k,1}]_1 \ldots [D_{k,1}]_7, \ldots, [D_{k,8}]_0[D_{k,8}]_1 \ldots [D_{k,8}]_7$
and in the $[D_{k,0}]_8[D_{k,0}]_9 \ldots [D_{k,0}]_{15}, [D_{k,1}]_8[D_{k,1}]_9 \ldots [D_{k,1}]_{15}, \ldots, [D_{k,8}]_8[D_{k,8}]_9 \ldots [D_{k,8}]_{15}$ This is accomplished as follows:

$$F_{D_k}=[D_{k,0},D_{k,1},\ldots,D_{k,7},0,0,0,0,0,0,0,0]$$

$$S_{D_k}=[D_{k,8},D_{k,9},\ldots,D_{k,15},0,0,0,0,0,0,0,0]$$

where $F_{D_k}$ stands for the FIRST bits coming from channel k and $S_{D_k}$ stands for the SECOND bits coming from channel k. Interpreting $F_{D_k}$ and $S_{D_k}$ as elements of $GF(2^{16})$, the method for computing the syndromes is then to compute $$S_i \leftarrow [H_0]_i(F_{D_0} \oplus \beta_1^i F_{D_1} \oplus \beta_2^i F_{D_2} \oplus \beta_3^i F_{D_3} \oplus \beta_4^i F_{D_4}) \quad (6)$$

and then when the second beat of data is received, $$S_i \leftarrow (1/z)S_i \oplus [H_0]_i (S_{D_0} \oplus \beta_1^i F_{D_1} \oplus \beta_2^i F_{D_2} \oplus \beta_3^i F_{D_3} \oplus \beta_4^i F_{D_4}) \quad (7)$$

where in the above, (1/z) denotes the inverse of the $GF(2^{16})$ element z (see Galois Field construction notes at the beginning of this document). The key point to notice is that each 16-bit symbol in the vector $(F_{D_0} \oplus \beta_1^i F_{D_1} r \beta_2^i F_{D_2} \oplus \beta_3^i F_{D_3} \oplus \beta_4^i F_{D_4})$ is of the form:

$$[?,?,?,?,?,?,?,?,0,0,0,0,0,0,0,0]$$

where ? is either 0 or 1. Multiplication of $[H_0]_i$ times a vector with symbols having this structure in fact only requires half of the binary columns of $[H_0]_i$ (more precisely, the first half of each symbol column). A similar remark applies to the computation in (7), which requires the same binary columns of $[H_0]_i$ as the computation (6).

An embodiment of computation of the channel adjusted syndromes. To compute the $S^{(-i)}$ syndromes, use $S^{(-i)}=S \oplus B_i(H_0 Z)$ An embodiment of a mathematical derivation of solution to the quartic. Given locations $x_1, \ldots, x_e \in GF(2^q)$ for some q, let eqnarray $$\Lambda(x_1, \ldots, x_e)=\{a:a=\Sigma_{x \in X} x_i 0.\text{lin for some } 0.\text{lin } A \subset \{x_1, \ldots, x_e\}\}$$

An embodiment of how to solve the quartic follows. For the $e_x, e_y$ computations, 4 coefficients needed to be calculated, the coefficient of $S_2$ in $e_x$ was $1/(x^2+xy)$, while the coefficients of $S_2$ in $e_x$ was $1/(y^2+xy)$. In this embodiment, instead of solving 2 quadratics serially, 2 quadratics are solved in parallel.

$$dr^4+r^2(xy+x^2+y^2)+r(xy^2+x^2y)+\alpha=0$$

is equivalent to either or both of the following 2 systems of equations:

$$r^2 + yr = z_x$$

$$z_x^2 + (xy + x^2)z_x = \alpha$$

$$r^2 + xr = z_y$$

$$z_y^2 + (xy + y^2)z_y = \alpha$$

The second equation in each set can be normalized using $z_x = (xy + x^2)w_x$ and $z_y = (xy + y^2)w_y$ to produce:

$$w_x^2 + w_x = \frac{\alpha}{(xy + x^2)^2}$$

$$w_y^2 + w_y = \frac{\alpha}{(xy + y^2)^2}$$

whose solutions are connected to the first equations via:

$$\frac{r^2 + yr}{xy + x^2} = w_x$$

$$\frac{r^2 + xr}{xy + y^2} = w_y$$

Using these identities the error value equations can be rewritten as:

$$e_x = \frac{S_2 + yS_1}{x^2 + xy} + ew_x$$

$$e_y = \frac{S_2 + xS_1}{y^2 + xy} + ew_y$$

Now consider $xw_x + yw_y$, using the equations above:

$$xw_x + yw_y = \frac{r^2 + yr}{x + y} + \frac{r^2 + xr}{x + y} = r$$

Note that no additional pre-computation is required since this embodiment is just using the square of the coefficients of $S_2$ for $e_i$. Now this embodiment can directly compute $r = xw_x + yw_y$, where it may be required to add 1 to either or both of $w_x$ and $w_y$, since each equation has 2 solutions. If 1 is added to $w_x$ then we add e to $e_x$, if 1 is added to $w_y$ then e is added to $e_x$.

When both x and y are zero, an embodiment computes r as the unique root of:

$$r^4 = \alpha$$

since taking fourth roots is a linear map on $GF(2^k)$.

If y=0 but x is nonzero, an embodiment can solve for $w_x$ as above, and since:

$$w_x = \frac{r^2}{x^2}$$

an embodiment can recover r with:

$$r = x\sqrt{w_x}$$

Since the denominator for $e_x$ is well defined, the same formula remains valid when y=0. In this case set $e_x$=0.

FIG. 7 depicts a table that summaries updates that need to be performed to r, $e_x$ and $e_y$ that need to be performed according to which solution to the quartic is found to be a valid solution.

FIG. 8 depicts a table that includes a binary pattern corresponding to each symbol (equivalently chip or memory device) in an embodiment of the RAIM code. In an embodiment, this is the pattern that x and/or y need to be set to when the corresponding chip is to be marked as suspect.

Figure 9:
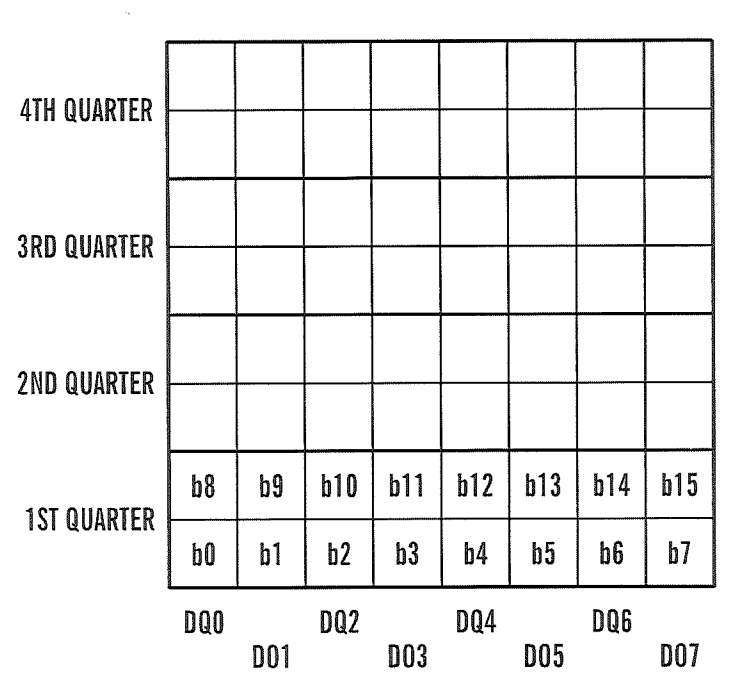

FIG. 9 depicts an error control code symbol definition (DDR3 device) according to an embodiment. The 16 bit symbol depicted in FIG. 9 is received over two DDR3 transfers. The RAIM code is applied four times across the burst of 8 in the DRAM, each processing 64 bytes worth of data for a total of 256 bytes.

Generalization to Arbitrary Number of Chips, Channels, and Redundancy.

Generalization: Preliminaries.

Given locations $x_1, \ldots, x_e \in GF(2^q)$ for some q, $$\Lambda(x_1, \ldots, x_e) = \left\{ a : a = \sum_{x \in \chi} x_i \text{ for some } A \subset \{x_1, \ldots, x_e\} \right\}$$

where the set A can be the null set (and thus $0 \in \Lambda(x_1, \ldots, x_e)$), and let the associated polynomial be:

$$p(r, x_1, \ldots, x_e) = \Pi_{\alpha \in \Lambda(x_1, \ldots, x_e)}(r \oplus \alpha)$$

It is known that $p(r, x_1, \ldots, x_e)$ is a linearized polynomial: the only powers of r that are present in this polynomial are an integer power of 2 (the zeroth power inclusive). Because of this, the following equality holds for any $r_1, r_2 \in GF(2^q)$:

$$p(r_1 \oplus r_2, x_1, \ldots, x_e) = p(r_1, x_1, \ldots, x_e) \oplus p(r_2, x_1, \ldots, x_e)$$

Note that $$\Lambda(x_1, \ldots, x_e) = \Lambda(x_1, \ldots, x_{e-1}) \cup \{x_e \oplus \Lambda(x_1, \ldots, x_{e-1})\}$$

where $a \oplus B$ for an element $a \in GF(2^p)$ and a set B with elements from $GF(2^p)$ denotes the set formed by adding every element of B to a. As a consequence, $$p(r, x_1, \ldots, x_e) = \left[ \prod_{\alpha \in \Lambda(x_1, \ldots, x_{e-1})} (r \oplus a) \right] \left[ \prod_{\alpha \in \Lambda(x_1, \ldots, x_{e-1})} (r \oplus x_e \oplus a) \right] \quad (8)$$

$$= p(r, x_1, \ldots, x_{e-1}) p(r \oplus x_e, x_1, \ldots, x_{e-1})$$

$$= p(r, x_1, \ldots, x_{e-1})[p(r, x_1, \ldots, x_{e-1}) \oplus p(x_e, x_1, \ldots, x_{e-1})]$$

Generalization: Construction of Parity Check Matrix.

As before, let N be the number of symbols in a channel, and let M denote the number of channels, and let r be the number of checks that need to be designed. This section is devoted to presenting a method for constructing check matrices of the form $H=[H_0 \; H_1 \; \ldots \; H_{M-1}]$ where $$H_i = \begin{bmatrix} X_{i,0} & X_{i,1} & \ldots & X_{i,N-1} \\ X_{i,0}^2 & X_{i,1}^2 & \ldots & X_{i,N-1}^2 \\ X_{i,0}^4 & X_{i,1}^4 & \ldots & X_{i,N-1}^4 \\ \vdots & \vdots & \ddots & \vdots \\ X_{i,0}^{2^r} & X_{i,1}^{2^r} & \ldots & X_{i,N-1}^{2^r} \end{bmatrix} \quad (9)$$

so that for every $i \in \{0, \ldots, M-1\}$ the matrix $$H^{(-i)} = [H_0 \oplus H_i \ldots H_{i-1} \oplus H_i H_{i+1} \oplus H_i \ldots H_{M-1} \oplus H_i]$$

is maximum distance separable (MDS), that is, any choice of r columns of $H^{(-i)}$ results in a r×r matrix that that is invertible. This is a highly desirable property as it results in codes for this application with maximal strength.

It is assumed that the elements $X_{i,j} \in GF(2^q)$, where q is a design parameter. The code construction is based on the following blocks:

1) A binary code for codewords with a total of M bits that can detect up to r bit errors for r even or r+1 bit errors for r odd. Let $r_b$ be the (binary) redundancy of this code. Let the columns of a parity check matrix for this code be $\beta_0, \beta_1, \ldots, \beta_{M-1}$. Thus, $\beta_i$ is regarded as an element of GF(2 raised to the $r_b$ power).

2) A code for $r_b$-bit symbols (that is, a code defined over GF(2 raised to the $r_b$ power)) and codewords with a total of N symbols, capable of detecting up to r symbol errors. Let $r_s$ denote the redundancy (in symbols) of this code. Let the columns of a parity check matrix for this code be $\gamma_0, \ldots, \gamma_{N-1}$. Note that. The code construction then sets $\gamma_i \in GF(2^{r_b})^{r_s}$.

The code construction then sets $X_{i,j} = \beta_i \gamma_j$. Note that this results in a field size parameter of $q = r_b \times r_s$. In general terms, good binary codes for item (1) above and good symbol codes for item (2) above are desired. Candidates for the former include the binary repetition code (where the codewords are 00 . . . 0, 11 . . . 1), Hamming codes, BCH codes, etc. Candidates for the latter include Reed-Solomon codes and non-binary BCH codes in general.

In an embodiment of the main code described herein, r=4, M=5, N=9. For the binary (item 1) the following is used:

$$[\beta_0 \; \beta_1 \; \beta_2 \; \beta_3 \; \beta_4] = \begin{bmatrix} 1 & 0 & 0 & 0 & 1 \\ 0 & 1 & 0 & 0 & 1 \\ 0 & 0 & 1 & 0 & 1 \\ 0 & 0 & 0 & 1 & 1 \end{bmatrix}$$

which is the parity check matrix of a binary repetition code with total length 5. It can be easily seen that this code can detect any 4 bit errors, as required by the construction. For the code (item 2), an embodiment employs a Reed-Solomon code defined over symbols in $GF(2^4)$ that has a total codeword length of 9 and has exactly 4 checks of redundancy.

Generalization: General Method for Finding Modified Syndromes.

Following a general method is described for finding modified syndromes which do not contain information about errors in known position, and where the original syndromes come from a parity check matrix of the form (10,11).

To apply the technique described below to the class of codes that have been considered herein, it is important to note that the parity check matrix (9) above could be that associated with the channel adjusted syndromes. Indeed, due to the 1, 2, 4, . . . structure of the original check matrix employed in the class of codes described herein, the channel adjusted syndromes are known to be also associated with a parity check matrix of the form (9). This observation is the key underlying insight that enables the class of error correction codes with simple channel parity in embodiments described herein.

Suppose that x is a vector that includes e nonzero values with magnitudes $e_1, \ldots, e_e$ at locations $x_1, \ldots, x_e$, respectively. Additionally, x includes t more nonzero values (with t=0 a possibility) with magnitudes $w_1, \ldots, w_t$ and locations $y_1, \ldots, y_t$. Thus x is thought of as an error vector with corresponding syndrome:

$$S_1 = \sum_{i=1}^{\varepsilon} x_i e_i \oplus \sum_{i=1}^{t} y_i w_i$$

$$S_2 = \sum_{i=1}^{\varepsilon} x_i^2 e_i \oplus \sum_{i=1}^{t} y_i^2 w_i$$

$$S_4 = \sum_{i=1}^{\varepsilon} x_i^4 e_i \oplus \sum_{i=1}^{t} y_i^4 w_i$$

$$\vdots$$

$$S_{2^r} = \sum_{i=1}^{\varepsilon} x_i^{2^r} \varepsilon_i \oplus \sum_{i=1}^{t} y_i^{2^r} w_i$$

Now consider the following calculation:

$$S_{1,1} = x_1 S_1 \oplus S_2$$
$$S_{2,1} = x_1^2 S_2 \oplus S_4$$
$$S_{4,1} = x_1^4 S_4 \oplus S_8$$
$$\vdots$$
$$S_{2^{r-1},1} = x_1^{2^{r-1}} S_{2^{r-1}} \oplus S_{2^r}$$

where S subscript $2^i$,j stands for the $i^{th}$ syndrome after j errors have been removed from the syndrome. Note that $$S_{1,1} = \sum_{i=2}^{e} (x_i^2 \oplus x_1 x_i) e_i \oplus \sum_{i=1}^{t} (y_i^2 \oplus x_1 y_i) w_i$$

$$S_{2,1} = \sum_{i=2}^{e} (x_i^2 \oplus x_1 x_i)^2 e_i \oplus \sum_{i=1}^{t} (y_i^2 \oplus x_1 y_i)^2 w_i$$

$$S_{4,1} = \sum_{i=2}^{e} (x_i^2 \oplus x_1 x_i)^4 e_i \oplus \sum_{i=1}^{t} (y_i^2 \oplus x_1 y_i)^4 w_i$$

-continued $$S_{2^{r-1},1} = \sum_{i=2}^{e}(x_i^2 \oplus x_1 x_i)^{2^{r-1}} e_i \oplus \sum_{i=1}^{t}(y_i^2 \oplus x_1 y_i)^{2^{r-1}} w_i \quad (5)$$

so that the equations above may be interpreted as $r-1$ syndromes for an error vector with errors $\{e_2, \ldots, e_e\}$ and $\{w_1, \ldots, w_t\}$ with locations:

$$\{x_i^2 \oplus x_1 x_i\}_{i=2}^{e} \text{ and } \{y_i^2 \oplus x_1 y_i\}_{i=1}^{t}$$

To remove the contribution of error $e_2$, the same technique described above may be applied but with the new locations. This will lead to a set of $r-2$ syndromes $\{T_{2^i,2}\}_{i=1}^{r-2}$ and to a new set of $e-2$ and $t$ error locations to which the procedure can be applied again.

The discussion above is now generalized. Let $x_{i,j}$ denote the location assigned to error $i$ (from the errors with known locations) after the first $j$ errors $e_1, \ldots, e_j$ have been removed from the syndromes. Thus:

$$x_{i,0} = x_i \text{ and } x_{i,1} = x_i^2 \oplus x_1 x_i.$$

Then, for:

$$i \in [j+1, \ldots, e], j \in [1, \ldots, e],$$

$$x_{i,j} = x_{i,j-1}^2 \oplus x_{i,j-1} x_{j,j-1} \quad (10)$$

Similarly, if $y_{i,j}$ denotes the location assigned to error $i$ (from the errors with unknown locations) after $j$ errors have been removed, for $i \in [1, \ldots, t]$ and $j \in [1, \ldots, e]$, then:

$$y_{i,j} = y_{i,j-1}^2 \oplus y_{i,j-1} x_{j,j-1}$$

Note that the expression in the right hand side of (10) is a polynomial on $x_{i,0}$ in which the coefficients are a function of $x_{1,0}, x_{2,0}, \ldots, x_{j,0}$. By denoting this polynomial as $u_{i,j}(\xi)$ (where $x_{i,0}$ has been substituted for $r$), the following relation is obtained: $u_{i,j}(r) = u_{i,j-1}(r)^2 \oplus u_{i,j-1}(r) u_{j,j-1}(x_{j,0})$, where the fact that the expression $x_{j,j-1}$ that appears in (10) is a function of $x_{1,0}, \ldots, x_{j,0}$ but NOT a function of $x_{i,0}$, since $i \geq j+1$. From this it is clear that $x_{i,j} = p(x_i, x_1, \ldots, x_{j-1})$. From a similar reasoning, it can be deduced that $y_{i,j} = p(yj, x_1, \ldots, x_j)$. The relations will be used below. From the syndrome perspective, for $j \in [1, \ldots, e]$ $$S_{1,j} = S_{1,j-1} x_{j,j-1} \oplus S_{2,j-1}$$

$$S_{2,j} = S_{2,j-1} x_{j,j-1}^2 \oplus S_{4,j-1}$$

$$S_{4,j} = S_{4,j-1} x_{j,j-1}^4 \oplus S_{8,j-1}$$

$$\vdots$$

$$S_{2^{r-j},j} = S_{2^{r-j},j-1} x_{j,j-1}^{2^{r-1}} \oplus S_{2^{r-j}\oplus 1,j-1}$$

The above already gives a sequential algorithm for computing modified syndromes from which the contribution of possible errors at known locations has been removed. In the case of the main code described herein, $e=2$ and instead of using a sequential algorithm, the expressions for the modified syndromes have been written in terms of $S_{1,0}, S_{2,0}, S_{4,0}, S_{8,0}$ directly, using the notation above (in the main code, the process of removing contributions of known chip errors is applied to each of the channel adjusted syndromes in parallel to meet minimal latency design guidelines).

After $e$ erasures have been removed, $r-e$ syndromes describing $t$ errors at unknown locations are left:

$$S_{1,e} = \sum_{i=1}^{t} y_{i,e} w_i$$

$$S_{2,e} = \sum_{i=1}^{t} y_{i,e}^2 w_i$$

$$S_{4,e} = \sum_{i=1}^{t} y_{i,e}^4 w_i$$

$$\vdots$$

$$S_{2^{r-e},e} = \sum_{i=1}^{t} y_{i,e}^{2^{r-e}} w_i$$

If there is exactly one error ($t=1$), then to find the new error location $\alpha = S_{2,e}/S_{1,e} = y_{1,e}$ can be computed. The variable $y_{1,e}$ is a function of $x_1, \ldots, x_e$, the order in which these known locations were presented to the syndrome modification removal algorithm described above, as well as $y_1$. It is desired to find $y_1$ from $\alpha = y_{1,e}$.

Generalization: General Method for Solving for a New Error Location.

From the earlier description above, it is known that $y_{1,e} = p(y_1, x_1, \ldots, x_e)$. Now suppose that equation $p(r, x_1, \ldots, x_e) \oplus \alpha = 0$ is being solved for $r$. Because the degree of this polynomial is $2^e$, this equation can have up to $2^e$ solutions in $GF(2^p)$. Nonetheless, these solutions form a linear space, and in particular, since $p(x_i, x_1, \ldots, x_e) = 0$ for $i \in \{1, \ldots, e\}$, if one solution $\xi \in GF(2^p)$ exists then every other solution can be found in the set $\xi \oplus \Lambda(x_1, \ldots, x_e)$. One way of solving this equation is by using the relation (8). Suppose a value of $z_1$ is found that solves:

$$z_1^2 \oplus z_1 p(x_e, x_1, \ldots, x_{e-1}) \oplus \alpha = 0$$

Then, once in possession of this value $z_1$, then the next equation to solve is:

$$p(r, x_1, \ldots, x_{e-1}) \oplus z_1 = 0$$

This, in turn, can be solved by first solving the quadratic $$z_2^2 \oplus z_2 p(x_{e-1}, x_1, \ldots, x_{e-2}) \oplus z_1 = 0$$

By continuing this line of thinking, the algorithm includes solving the equation $$z_i^2 \oplus z_i p(x_{e-i \oplus 1}, x_1, \ldots, x_{e-i}) \oplus z_{i-1} = 0$$

for $z_i$, where $z_{i-1}$ comes from an earlier iteration of the algorithm. This clearly results in a method for solving the general problem $p(r, x_1, \ldots, x_e) \oplus \alpha$ for $r$ using a sequence of $e$ quadratic solvers.

Note that in the description of algorithm that is used in the specific code described herein, a method for solving the degree 4 polynomial $p(r, x, y)$ is given which improves upon the description above in that it solves the quartic with two quadratics in parallel, instead of in series as described in here.

Diff-MDS Embodiment.

The following text describes an embodiment where a class error control codes which are termed "diff-MDS" codes that are custom designed for highly resilient computer memory storage. The error scenarios of concern range from simple single bit errors, to memory chip failures and catastrophic memory module failures. A general code construction and analysis framework will be presented, together with efficient encoding and decoding algorithms. A discussion of the potential advantages and disadvantages of this class of algorithms when compared to Reed-Solomon codes will also be given.

Diff-MDS Embodiment: Introduction.

The main memory of the majority of modern computer servers is structured so that any given read or write request from a processor is serviced through a parallel access to multiple dynamic random access memory (DRAM) chips. Error control codes whose codewords span these chips are used routinely to correct single bit errors caused, for example, by cosmic rays and alpha particles. Failures affecting multiple bits have also been observed, ranging from a small section of a chip to entire chip failures. For this type of occurrence, servers employ symbol (as opposed to bit) oriented codes capable of correcting bursts of bit errors.

A goal of an embodiment is to present coding techniques that further protect a server against another type of failure that arises from the manner in which chips are organized within a memory system. In systems architecture, a memory channel is an independent physical construct that a processor uses to communicate to a group of memory chips; typically a processor will have multiple memory channels and in some instances distribute an ECC word over multiple channels. Sometimes it is the case that the design of a memory channel has single points of failure. For example, the chips in a memory channel may share a memory buffer in common which may fail, and/or may share a common clock signal that can also result in correlated errors. The goal is then to design a memory system that can survive entire memory channel errors, in addition to the kinds of errors described earlier.

Embodiments described herein overcome technical challenges related to the requirement of obtaining a reliability and redundancy optimum design while keeping the complexity of the design to a point in which very aggressive latency, bandwidth and chip circuit area requirements set by a main memory application are met.

An embodiment utilized to attain these goals includes a new class of error control codes, referred to herein as diff-MDS codes. Described herein, is a systematic development of the foundations for how these codes are designed and analyzed, and the characteristics of the particular instance of this class of codes for use with RAIM memory systems is described.

Diff-MDS Embodiment: Preliminaries.

The error control codes that are discussed herein are defined over an N×M array of symbols, each of them comprised of p bits. Each symbol is regarded to be an element of the Galois Field with $2^p$ elements and is denoted as $GF(2^p)$. FIG. 10 illustrates how these symbols are labeled and organized. In the embodiment described herein, a column is a memory channel, and any element of a column is a memory chip. The upper index in parenthesis in $d_i^{(j)}$ denotes the channel index. The subscript indicates the chip within the channel. From these N×M symbols, k will be devoted to storing data and r=N×M−k will be used as redundant symbols.

Figure 11:
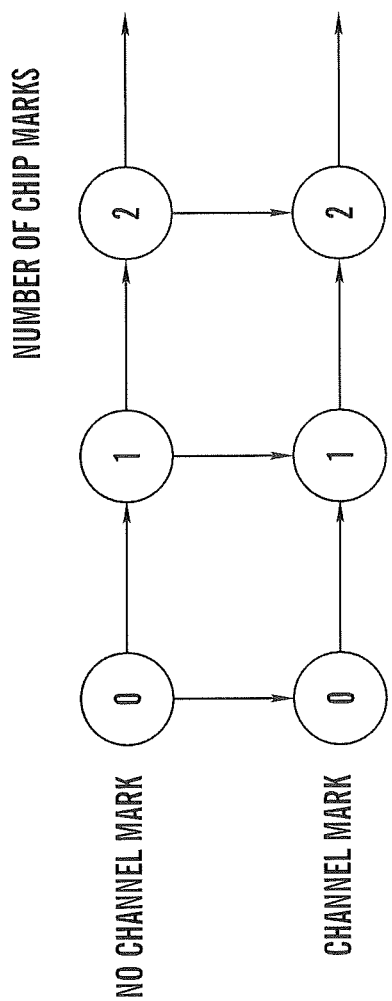
FIG. 11 depicts allowed transitions for array mark states in accordance with an embodiment.

Typically, a machine runs error free with occasional temporary errors affecting one symbol from FIG. 10, which depicts an array of symbols in the ECC, with M columns and N rows. Nonetheless, a hard error—whether single bit or multibit—may take place, and from that point onwards there is a significantly higher likelihood of an error being perceived at the associated symbol. Information about persistent faults is stored in the marking state of the memory; see FIG. 11, which depicts allowed transitions for array mark states. In addition to the state information of FIG. 11, the overall mark state includes a pointer to which chips and/or channel have been marked as bad. It is assumed that regardless of the present state, the code needs to correct $t_c$ and detect $t_d$ symbol errors in addition to those symbols that are marked as bad.

Whenever something is marked (as potentially with errors) the decoder treats the associated symbol or symbols as erasures, in the standard sense of information and coding theory. Doing so is expected to allow the decoder to correct all marked symbols and potentially new additional errors as well. It is assumed that a maximum of e chip marks may be stored for use in the decoding of a codeword of the error control code. In the most common use, these marks are applied sequentially as the system discovers hard chip errors, each time causing the marking state in FIG. 11 to transition to an adjacent state on the right until no more chip marks are available.

In addition to single symbol errors, a memory channel may fail, resulting in a new multisymbol error that is contained in a column in FIG. 10. The decoder is expected to deduce entirely on its own the memory channel containing the multisymbol error, even in the presence of chip marks in any place of the memory array, although in some instances there may be independent indications that a channel is failing. Using variants of well known arguments it is possible to deduce that it is mathematically impossible to design any code that accomplishes the task of locating (autonomously) the failing channel with 100% certainty unless the following relation is satisfied:

$$2N+e \leq r$$

In an embodiment, e=2, N=9, M=5, k=32, implying that r=13. Therefore, it is provably impossible to locate a failing channel with 100% certainty. Nonetheless, it is still feasible to find a failing channel with overwhelmingly high probability. Furthermore, once the bad channel is located (by any available means, this is either by the decoder or by another agent), then a system that achieves 100% correction of this channel need only satisfy the relation:

$$N+e \leq r$$

which holds in the specific instance of the present embodiment. This leads to the notion of a channel mark, which is similar to the idea of a chip mark, although in this case applied to an entire channel. Whenever a channel mark is in place, the decoder no longer is required to find the location of a bad channel and may assume instead that the bad channel is the one pointed to by the channel mark. The judicious use of channel marks by a memory system results in the elimination of the problem of the finite probability of not being able to correct failing channel for all practical purposes. As one uses chip or channel marks, the amount of redundancy that is effectively available for the correction and detection of any additional errors on symbols that are not marked decreases, since the symbols that are marked also need to be corrected. For the purposes of the development of a foundation to study error control codes for this embodiment, it is assumed that regardless of the marking state (as given in FIG. 11) $t_c$ additional errors will need to be corrected in addition to any symbol errors that are marked (chip or channel), and td additional errors will need to be detected.

One skilled in the theory of Reed-Solomon (RS) error correcting codes will notice that as long as NM≤$2^p$−1, RS codes appear to be a candidate for this problem, since they are maximum-distance-separable (MDS) and hence have strong optimality properties for settings with erasures and/or unknown symbol errors. It can be indeed shown that this is the case from the standpoint of the degree of reliability that these codes offer. Nonetheless, the large burst of length N symbols that needs to be detected and corrected in potential combination with other errors can introduce implementation complexity problems, particularly in the high performance setting of the embodiment.

Note that if the embodiment only had to correct a memory channel in error, and which channel was in error was always known, then one of the M channels could always be a simple parity of the other M−1 channels as it is done in RAID systems, with decoding being a straightforward operation. For this simple abstract problem, clearly Reed-Solomon codes are unnecessary. The methodology in the embodiment described herein starts by assuming that one of the memory channels will be a simple parity of the other channels. Starting from this restriction, a theory of how to construct optimal codes for this application is developed. The codes described herein present favorable implementation characteristics when N is relatively large with respect to $t_c$ and $t_d$, in an asymptotic sense. Nonetheless, in any given application, the case for one kind of code versus another (Reed-Solomon, diff-MDS, etc) may not be immediately clear and a more detailed analysis is required.

Diff-MDS Embodiment: Mathematical Problem Definition.

For any positive integer n, let $GF(2^p)^n$ denote the space of vectors of length n with elements in $GF(2^p)$. Let $d \in GF(2^p)^{NM}$ denote a vector that is stored in any given memory location. The memory has M channels and thus:

$$d = ((d^{(0)})^T (d^{(1)})^T \ldots (d^{(M-1)})^T)^T$$

where the upperscript T denotes vector/matrix transpose, and where $$d^{(i)} = \begin{pmatrix} d_0^{(i)} \\ d_1^{(i)} \\ \vdots \\ d_{N-1}^{(i)} \end{pmatrix}$$

for $i \in \{0, \ldots, M-1\}$.

Thus for each $j \in \{0, \ldots, M-1\}$, $d^{(j)} \in GF(q)^N$ and for $i \in \{0, \ldots, N-1\}$, $d_i^{(j)} = d_{jN+i}$.

It is assumed that d is a codeword of the code defined by a parity check matrix H that has dimensions $(n+\Delta) \times (NM)$ and entries in $GF(2^p)$. The parameter $\Delta > 0$ controls the excess redundancy one possesses to provide protection against individual symbol errors, for locating channel errors and for ensuring that any corrections that are applied are sound. Any codeword of the code by definition must satisfy $Hd=0$. The check matrices of interest can be written as:

$$H = \begin{pmatrix} I_N & I_N & \ldots & I_N \\ \hat{H}^{(0)} & \hat{H}^{(1)} & \ldots & \hat{H}^{(M-1)} \end{pmatrix} \quad (11)$$

where $I_N$ denotes the N×N identity matrix and $$\hat{H} \triangleq (\hat{H}^{(0)} \hat{H}^{(1)} \ldots \hat{H}^{(M-1)}) \quad (12)$$

where $\hat{H}$ is a $\Delta \times MN$ matrix. The essential constraint in (11), is that $\Sigma_{j=0}^{M-1} d^{(j)} = 0$.

A code with check matrix:

$$(I_N I_N \ldots I_N)$$

is referred to herein as a simple parity check code. Because the codes (11) are obtained by expurgating codewords from a simple parity check code, any code whose parity check matrix can be written as (11) is referred to as an expurgated simple parity check code, and $\hat{H}$ is referred to as the expurgating matrix.

The marking state of the memory describes:

1. Whether a channel is marked and the location of the possible channel mark if applicable.

2. How many chips are marked (up to e chips), including the information of which chips are marked.

If there is no channel mark and i chip marks, this is referred to as being in the marking state (0, i). If there is a channel mark and i chip marks, this is referred to as being in the marking state (1, i). This notation is in reference to FIG. 11, where the first index refers to a row and the second index refers to a column. Note that to be accurate, the marking state also includes the identity of the entities to which marks point to; this shorthand will be often useful though and should cause no confusion. In order to compare the strength of various choices of H (not necessarily expurgated simple parity check codes), requires settling on a precise set of metrics for evaluating codes. A description of these metrics follows.

For all marking states of the form (0, i), it is assumed that in every marked chip, if any, there can be any kind of error, or no error at all. In addition to an assumption that any errors on marked chips can be corrected, the code's strength is characterized by: the number $t_c^{(0,i)}$ of simultaneous chip errors it can correct, the number $t_d^{(0,i)}$ of simultaneous chip errors it can detect (or correct); and the probability $p_c^{(0,i)}$ of correcting a channel error, under the random channel error model (see below).

A random channel error is a channel error which can be modeled as: 1) choosing the channel in error from the set $\{0, 1, \ldots M-1\}$ uniformly at random; and 2) choosing for the error in the chosen channel a vector uniformly from $GF(2^p)^N$. Note that this includes the possibility that no error at all is added, nonetheless this is of no consequence to the analysis for sufficiently large (but still practical) p and N. Note also that this error model allows for channel errors on channels where there may be chip marks.

For all marking states of the form (1, i) assume that in the marked channel and any marked chip there can be any kind of error or no error at all. All marked errors are assumed to be correctable. In addition, the code's strength is characterized by: the number $t_c^{(1,i)}$ of simultaneous chip errors it can correct; and the number $t_d^{(1,i)}$ of simultaneous chip errors it can detect or correct.

Recall that all the codes in this embodiment are assumed to be capable of encoding k symbols from $GF(2^p)$ worth of "user data" using a redundancy r=NM−k. Given (N, M, k) and e, the number of marked chips one can have, the first problem is to characterize, without the restriction on H given by (11) (but still assuming a linear code), what are the allowable values for $\{t_c^{(0,i)}, t_d^{(0,i)}, p_c^{(0,i)}, t_c^{(1,i)}, t_d^{(1,i)}\}_{i=0}^{e-1}$.

The second problem is to find a class of error control codes whose parity check matrix satisfies the restriction (11) that are optimal in the sense that a code can be found that meets or alternately improves on any point of the set of allowable values.

The third problem is to develop practical techniques for encoding and decoding these codes. Described herein are partial solutions for all three problems. For the second problem, focus is on the case where $2^p < NM$ and code construction methodologies are presented that are optimal for sufficiently large values of p. Fortunately, for the particular application parameters in this embodiment it will turn out that the theory is applicable in a real practical sense.

Diff-MDS Embodiment: Codes.

For $j^* \in \{0, \ldots, M-1\}$, define the matrix $\hat{H}^{(-j^*)}$ by deleting the $j^*$th component matrix from $\hat{H}$ and subtracting it from each of the remaining matrices. For example, the case when $j^*$ is neither 0 nor M−1 is as follows:

$$\hat{H}^{(-j^*)} = (\hat{H}^{(0)} - \hat{H}^{(j^*)} \ldots \hat{H}^{(j^*-1)} - \hat{H}^{(j^*)} \hat{H}^{(j^*+1)} - \hat{H}^{(j^*)} \ldots \hat{H}^{(M-1)} - \hat{H}^{(j^*)})$$

The definition of $\hat{H}^{(-0)}$ and $\hat{H}^{(-(M-1))}$ follow directly from the explanation and example above. Note that in GF($2^p$), subtraction is identical to addition, so the use of the − assign is somewhat superfluous in this case. Nonetheless, all of the results in this embodiment can be extended to finite fields with Characteristic other than 2, and thus the choice to use the − sign. For $j \in \{0, \ldots, M-1\}$ and for an arbitrary vector $v \in GF(2^p)^{NM}$, let $v^{(-j)}$ the vector obtained by deleting from v the jth subcomponent. This is illustrated with an example when $i^*$ is neither 0 nor M−1:

$$v^{(-j)} = (v^{(0)}, \ldots, v^{(j-1)}, v^{(j+1)}, \ldots, v^{(M-1)})$$

Note that $\hat{H}^{(-j^*)}$ is a $\Delta \times N(M-1)$ matrix with elements in GF($2^p$). Let A be any matrix with entries in GF($2^p$). Let d(A) denote the minimum symbol distance of the code defined by parity check matrix A. This is, d(A) is the largest integer such that any choice of d(A)−1 columns of A are linearly independent. A code with parity check matrix is said to be maximum-distance-separable (MDS) if d(A) is equal to the number of rows of A plus 1.

It is said that $\hat{H}$ is Diff-MDS if $\hat{H}^{(-j^*)}$ is MDS for every $j^* \in \{0, 1, \ldots, M-1\}$. The definition of diff-MDS codes is motivated with an example of how to decode a code whose parity check matrix has the form (11). In this example, channel 0 is affected with a "serious" error $\delta^{(0)} \in GF(2P)^N$ which is any nonzero vector. Channels 1 through M−1 are affected with errors $\xi^{(1)}$ through $\xi^{(M-1)}$, which collectively, have exactly t nonzero entries (and hence t errors). Thus an encoded vector d is corrupted so that:

$$v = \begin{pmatrix} d^{(0)} + \delta^{(0)} \\ d^{(1)} + \xi^{(1)} \\ \vdots \\ d^{(M-1)} + \xi^{(M-1)} \end{pmatrix}$$

is what is retrieved from the memory. Note that:

$$\sum_{j=0}^{M-1} v^{(i)} = \delta^{(0)} + \sum_{j=1}^{M-1} \xi^{(j)} + \sum_{j=0}^{M-1} d^{(i)}$$

$$= \delta^{(0)} + \sum_{i=1}^{M-1} \xi^{(j)}$$

Suppose that it is known that the "serious" channel error $\delta^{(0)}$ was in channel 0. Subtracting $\sum_{i=0}^{M-1} v^{(i)}$ from channel 0 in v results in:

$$w = \begin{pmatrix} d^{(0)} - \sum_{j=1}^{M-1} \xi^{(j)} \\ d^{(1)} + \xi^{(1)} \\ \vdots \\ d^{(M-1)} + \xi^{(M-1)} \end{pmatrix}$$

Note that the large error $\delta^{(0)}$ has been removed but the smaller errors have now "propagated" from channels 1 through M−1 to channel 0. Now compute the $\hat{H}$-syndrome of w:

$$\hat{H}w = -\hat{H}^{(0)} \left( \sum_{j=1}^{M-1} \xi^{(j)} \right) + \sum_{j=1}^{M-1} \hat{H}^{(j)} \xi^{(j)}$$

$$= \sum_{j=1}^{M-1} (\hat{H}^{(j)} - \hat{H}^{(0)}) \xi^{(j)}$$

$$= \hat{H}^{(-0)} w^{(-0)}$$

where the latter follow from the definitions made at the beginning of this section.

The key observation to make here is that a decoder can actually compute the $\hat{H}^{(-0)}$-syndrome of $w^{(-0)}$, which contains every other error not in channel 0. Thus, if the linear code with parity check matrix $\hat{H}^{(-0)}$ can correct t errors, it is possible to correct the error in channel 0 and the additional t errors in the other channels.

From this discussion it becomes clear that if one must use the restriction (11), then one would like for the linear codes with parity check matrices $\hat{H}^{(-0)}, \ldots, \hat{H}^{(-(M-1))}$ to be good codes in the sense of minimum distance as well as in the sense of their ease of decoding.

It should now be understood by those skilled the art why the diff-MDS property is important in this particular setting. If $\hat{H}$ is diff-MDS, then the linear codes defined by $\hat{H}^{(-0)}, \ldots, \hat{H}^{(-(M-1))}$ are precisely MDS and hence optimum from the standpoint of minimum distance.

The present discussion will be elaborated upon in the following section, where various properties of expurgated simple parity check codes will be characterized as well as the particular class of diff-MDS codes.

Diff-MDS Embodiment: The Performance of Expurgated Simple Parity Check Codes.

Throughout this and the subsequent sections, we assume that H satisfies the restriction (11); and as usual $\hat{H}$ denotes the bottom $\Delta$ rows of H.

Define the "diff-minimum distance" of as $\hat{H}$ as $$d_{diff}(\hat{H}) = \min_{0 \leq i \leq M-1} d(\hat{H}^{(-i)})$$

This distance notion determines the majority of the key properties in expurgated simple parity check codes. A first observation is that it is linked to the conventional minimum distance of the code defined by H as follows:

Lemma 1: The matrix H of an expurgated simple parity check matrix code together with its expurgating matrix Ĥ (see equations (11, 12)) satisfy:

$$\left\lceil \frac{d_{\mathit{diff}}(\hat{H})}{1-1/M} \right\rceil \le d(\hat{H}) \le \left\lceil \frac{\Delta+1}{1-1/M} \right\rceil$$

where Δ is the number of rows in Ĥ.

The bounds in this lemma are tight when Ĥ is a diff-MDS matrix since in this case $d_{\mathit{diff}}(\hat{H})=\Delta+1$.

The following result summarizes the capability of a particular decoding architecture for expurgated simple parity check codes. The decoder architecture is given in the proof.

Theorem 1: Assume u≧0 chips are marked. Further assume that $$u+t_c^{(0,u)}+t_d^{(0,u)}<d(H) \tag{13}$$

$$u+t_d^{(0,u)}<d_{\mathit{diff}}(\hat{H}) \tag{14}$$

$$u+t_c^{(1,u)}+t_d^{(1,u)}<d_{\mathit{diff}}(\hat{H}) \tag{15}$$

and $t_d^{(0,u)}>t_c^{(0,u)}$, $t_d^{(1,u)}>t_c^{(1,u)}$.

Then an expurgated simple parity check code admits a decoder that can:

1) in the absence of a channel mark, in addition to correcting the errors in the marked chips: detect (but not necessarily correct) up to $t_d^{(0,i)}$ chips in error; correct up to $t_c(0,t)$ chips in error; detect any channel error, and correct it with probability at least $$1-\frac{M-1}{2^{p(d\in s(\hat{H})-1-u)}} \tag{16}$$

under the random channel error model; and 2) in the presence of a channel mark, in addition to correcting the errors in the marked channel and the marked chips: detect (but not necessarily correct) up to $t_d^{(1,u)}$ chips in error, and correct up to $t_c^{(1,u)}$ chips in error.

Proof Preliminaries.

The decoder that will be given in the proof will be based on processing the syndrome of the vector retrieved from the memory, as it is common in decoders for linear codes. Given a vector $v=x+e \in GF(2^p)^{NM}$ to decode, where x is the vector originally written to memory. Define the syndromes:

$$s=\hat{H}v\cdot z=\sum_{j=0}^{M-1}v^{(j)} \tag{17}$$

The channel modified syndromes are defined as:

$$s^{(-j)} \triangleq \hat{H}^{(-j)}v^{(-j)} = \hat{H}^{(-j)}e^{(-j)} \tag{18}$$

Let $$\{m_0,\ldots,m_{u-1}\} \subset M \triangleq \{0,\ldots,NM-1\}$$

denote the chip marks passed to the decoder.

If $A_1$ and $A_2$ are any two sets containing sequences from $GF(2^p)$ of identical length, then the set $A_1+A_2$ is defined by the following:

$$\mathcal{A}_1+\mathcal{A}_2=\{\xi:\exists\alpha_1\in\mathcal{A}_1,\alpha_2\in\mathcal{A}_2 \text{ such that } \xi=\alpha_1+\alpha_2\}.$$

Also note that in a field of characteristic 2, such as $GF(2^p)$, the addition and subtraction operators are identical.

Now define basic classes of error patterns. First are the patterns where the only errors are in channel j:

$$A_j=\{\xi\in GF(2^p)^{NM}:\xi^{(-j)}=0\}$$

Also defined is $A=U_{i=0}^{M-1}A_j$. Next there is the "up to t random errors" case, for t>0: $B_t=\{\xi\in GF(2^p)^{NM}:w(\xi)\le t\}$ where w(•) denotes the number of nonzero entries in the vector argument. Finally, define the set of errors patterns that only affect chips that are marked:

$$C = \{\xi \in GF(2^p)^{NM} \cdot \text{if } \xi_j \ne 0 \text{ for some } i \in \mathcal{M} \text{ then } i \in \{m_0,\ldots,m_{u-1}\}\}$$

Note that each of these sets contain the zero vector and in general can intersect in other ways.

Proof in the case there is a channel marked.

Suppose that channel j* is marked. In this case, it is assumed that the error pattern satisfies: $e \in A_{j*}+B_{t_d}^{(1,u)}+C$, since it is assumed that $t_d^{(1,u)}>t_c^{(1,u)}$. It is assumed, without loss of generality, that all of the u chip marks are not located in channel j* since the following argument can be applied by removing any such marks, thereby reducing the value of u. Note that from the definition of the channel modified syndromes in this section, the syndrome $s^{(-j*)}$ depends only on $e^{(-j*)}$, which excludes any errors in channel j*. The code with parity check matrix $\hat{H}^{(-j*)}$, which has minimum distance at least $d_{\mathit{diff}}(\hat{H})$, can be regarded as a u-erasure, $t_c^{(1,u)}$ random error correct and $t_d^{(1,u)}$ random error detect code as long as the condition (15) of the theorem is satisfied. Using any available decoder for this code results in recovering the error pattern $e^{(-j*)} \in GF(2^p)^{N(M-1)}$, unless an uncorrectable error has been detected. One can then recover the error in the channel marked through the relation $e^{(j*)}=z-\Sigma_{i \ne j*}e^{(j)}$. At this point all errors have been recovered (if the errors were correctable) and the decoder can add the e vector to v to retrieve x.

Proof in the Case where there is No Channel Marked.

The decoder for this case operates in two main steps. In the first step, the decoder searches for a unique $e' \in B_{t_c(0,u)}+C$ such that $He'=[z^T \ s^T]^T$. If it succeeds, then the error is claimed correctable, e' is the error pattern to be added to the data that was read from the memory and the decoding finishes. If it fails, then the decoder next searches for a unique $e' \in A+C$ such that $He'=[z^T \ S^T]^T$. As before if it succeeds then the decoder applies e' to the data, otherwise an uncorrectable error is declared. For the first step, we use a u-erasure, $t_c^{(1,u)}$ random error correct and $t_d^{(1,u)}$ random error detect decoder which by classic coding theory exists as long as condition (13) is satisfied.

It is assumed that this decoder will also ensure that the final correction e', if a correctable error has been found, has the same syndromes as the retrieved data, so that all information provided by all of the syndromes has been exhausted. A way of doing this is for this decoder to perform the correcting action, which if it succeeds it recovers the decoder's estimate of the errors affecting the retrieved data. The decoder would then follow with checking whether the estimated errors have the same syndrome as the retrieved data, overruling the previous correction as uncorrectable in case this is not true. This can be accomplished by either calculating the syndrome of the estimated errors and comparing them to the original ones, or alternately, deriving syndrome equations that need to be satisfied whenever there are at most t_c^(0,u) new errors in addition to the u erasures, and checking these equations. This derivation can be performed off line (during code design time) by combining the step of computing an estimate of the errors with the step of computing the syndromes of this estimates and the step of comparing these syndromes with the original syndromes.

Now suppose that $e \in (A+C) \setminus (B_{t_c}^{(0,u)}+C)$. First it is claimed that that for any $a \in B_{t_c(0,u)}+C$, $He \neq Ha$. This is an important conclusion that ensures that error patterns in $(A+C) \setminus (B_{t_c}^{(0,u)}+C)$ are not mistakenly corrected in the first step of the decoder, which is not equipped P to deal with them. If $\Sigma_j e^{(j)} - a^{(j)} \neq 0$ obviously $He \neq Ha$, so assume equality. This implies $\hat{H}(e-a) = \hat{H}^{(-j)}(e^{(-j)} - a^{(-j)})$. Note that $e - a \in A_j + B_{u+t_c}^{(0,u)}$ for some $j \in \{0, \ldots, M-1\}$. Therefore, there are not more than $u + t_c^{(0,u)}$ nonzero elements in the vector $(e^{(-j)} - a^{(-j)})$ and thus by (14) and the assumption that $t_c^{(0,u)}) < t_c^{(0,u)}$, $\hat{H}(e-a) \neq 0$, proving the claim.

Recall that detection is guaranteed (but not necessarily correction) in the case $e \in B_{t_d}^{(0,u)}+C$. As a matter of fact, $e \in (B_{t_d}^{(0,u)}+C) \setminus (B_{t_c}^{(0,u)}+C)$ if then by construction step 1 declares an uncorrectable error. It will be shown that under this condition for e, the subsequent decoder in step 2 either correctly decodes the pattern or declares an uncorrectable event; stated differently we want to guarantee that in this case the decoder never miscorrects. Although it has not yet been defined how the decoder in the second step operates, it will suffice to state that whatever correction it computes, it will have exactly the same syndromes as the retrieved data (as decoder 1 does) or otherwise declare an uncorrectable error. Under this assumption, it can be shown that miscorrection never happens by demonstrating that if $a \in A+C$, and $a \neq e$, then $Ha \neq He$. The proof for this uses same arguments employed in the previous paragraph, with the exception that the assumption (14) is used directly.

The decoder next processes all channel modified syndromes (18). It is noted that the syndrome $s^{(-j)}$ does not contain any contribution from errors in channel j, including any potential error in a chip marked if that chip happens to be in channel j. The decoder interprets, for each $j \in \{0, \ldots, M-1\}$ the code with parity check matrix $\hat{H}^{(-j)}$ to be a code that can correct up to u erasures. The corresponding decoder is the one cited by the following Lemma.

Lemma 2: Let A be a r×n parity check matrix of a linear code with entries in $GF(2^p)$. Let $u < d(A)-1$. Then there exists a decoder $g: \{0, \ldots, n-1\}^u \times GF(2^p)^n \to \{\text{correctable, uncorrectable}\} \times GF(2^p)^n$ for the linear code with this parity check matrix A with the property that it can correct any u erasures. Now let $\{i_0, \ldots, i_t-1\} \subset |\{0, \ldots, n-1\}$ be distinct but otherwise arbitrary indices, with $t \geq d(A)-1$. $x \in GF(2^p)^n$ be a codeword of this code. Let $e \in GF(2^p)^n$ be such that $e_i$ is chosen independently and uniformly at random from $GF(2^p)$ if $i \in \{i_0, \ldots, i_{t-1}\}$; no assumption is made about the remaining entries of e. Whenever the decoding x+e, this decoder will mistakenly declare "correctable" with probability at most $$\frac{1}{2^{p(d(A)-u-1)}}$$

regardless of the erasure locations.

For each $j \in \{0, \ldots, M-1\}$, the vector $x^{(-j)} + e^{(-j)}$ is passed to a decoder for the parity matrix $H^{(-j)}$, and the outputs from these M decodings are collected. If one and only one of these decodings results in a "correctable" outcome, then the corresponding channel is claimed by the decoder to be the channel that failed. Decoding is then finalized in a manner similar to that described in the section titled Proof in the case there is a channel marked, above. Since at this point it can be considered that the channel that failed to be marked (in this case by the decoder itself). If two or more decodings result in a correctable outcome, then the decoder claims an uncorrectable error.

If $e \in (A_{j*}+C) \setminus (B_{t_c}^{(0,u)}+C)$ for some j*, then it is easy to see that during the decoding of $x^{(-j*)} + e^{(-j*)}$ assuming a code with check matrix $\hat{H}^{(-j*)}$ a correctable will be obtained as an outcome as there are no more than u erasures to be solved for. Thus for the pattern to be correctable by the main decoder, none of the other M-1 decoders must claim a correctable event. The probability of an uncorrectable error can now be computed under the assumption that channel j* has been corrupted with a vector e(j_) that is drawn uniformly at random from $GF(2^p)^N$. In Lemma 2 substitute $t \leftarrow N$, $n \leftarrow N(M-1)$, $r \leftarrow \Delta$, $A \leftarrow \hat{H}^{(-j)}$ to obtain the assertion that if $j \neq j*$, then when decoding $x^{(-j)} + e^{(-j)}$ for the parity check matrix $\hat{H}^{(-j)}$ will result in a miscorrection with probability at most $$\frac{1}{2^{p(d_{diff}(\hat{H})-u-1)}}$$

Since there are M−1 different decodings one will perform (in addition to the one at channel j*) using the probability union bound the probability of two or more correctable decodings is found to be at most $$\frac{M-1}{2^{p(d_{diff}(\hat{H})-u-1)}}$$

finalizing the proof of the Theorem.

Proof of Lemma 2.

Let $\{j0, \ldots, ju-1\}$ be the erasure locations passed to the decoder g. As it is well known, in order to solve for u erasures, the decoder g computes the syndrome s by multiplying the matrix A times the retrieved vector, extracts the u columns of A corresponding to the u erasures and solves the linear system $[A_{j_0} A_{j_1} \ldots A_{j_{u-1}}]v = s$ for the vector v, which will contain the error magnitudes. This can be accomplished because by assumption, the u columns of the matrix above are linearly independent. Note that for any given choice of $\{j_0, \ldots, j_{u-1}\}$, there are exactly $2^{up}$ distinct possible values for s that must be mapped to distinct error magnitudes. Let these "correctable" syndromes be denoted by $C_{j0}, \ldots, _{ju-1}$. The decoder will claim an uncorrectable error whenever the calculated syndrome s is not in $C_{j0}, \ldots, _{ju-1}$, and otherwise will claim a correctable error.

For the remainder of the proof, let $s = A(x+e)$ with x and e defined as in the lemma statement. Since any $d(A)-1$ columns of the matrix A are linearly independent, there must be $d(A)-1$ rows of the matrix $[A_{i_0} A_{i_1} \ldots A_{i_{(A)-2}}]$ that are linearly independent. Let the indices of these rows be $\{h_0, \ldots, h_{d(A)-2}\}$. Extracting these rows results in an invertible square matrix M. Note that the vector $$\xi = M \begin{pmatrix} e_{i_0} \\ e_{i_1} \\ \vdots \\ e_{i_{d(A)-2}} \end{pmatrix}$$

is, statistically speaking, a vector chosen uniformly at random from $GF(2^p)^{NM}$. The reason for this is that the right hand side has this property, and M is an invertible matrix. The syndrome s, when subsampled at the same rows, can be written as: $s_{\{h_0,\ldots,h_{d(A)-2}\}} = \xi + \chi$ for some vector $\chi$. The vector $\chi$, which in general can have both random and deterministic entries, is statistically independent from $\xi$. The reason is that any random component of $\chi$ depends on elements of e not in the list $\{e_{i_0}, \ldots, e_{i_{d(A)-2}}\}$, and all the entries of e are independent. As a result, $s_{\{h_0,\ldots,h_{d(A)-2}\}}$ is also a vector chosen uniformly at random from $GF(2^p)^{NM}$. Through a similar reasoning, it can be seen that the vector $s_{\{h_0,\ldots,h_{d(A)-2}\}}$ is statistically independent of the vector $s_{\{0,\ldots,h_{d(A)-2}\}}$ where the complement is taken with respect to the index set $\{0, \ldots, r-1\}$. As a consequence of this, if $z \in GF(2^p)^{NM}$ is any given deterministic vector, then $$P(s = z) \leq \frac{1}{2^{p(d(A)-1)}}.$$

Finally note that for any given erasure locations $\{j0, \ldots, ju-1\}$ the set of correctable syndromes $C_{j_0, \ldots, j_{u-1}}$ has cardinality exactly $2^{pu}$. An embodiment of the decoder miscorrects whenever $Ae \in C_{j_0, \ldots, j_{u-1}}$ and thus the miscorrection probability must satisfy $$P(s \in C_{j_0, \ldots, j_{u-1}}) \leq \frac{1}{2^{p(d(A)-u-1)}}.$$

Diff-MDS Embodiment: A Family of Practical Diff-MDS Codes.

Recall that the codes under consideration have a parity check matrix that can be written as in (11,12):

$$H = \begin{pmatrix} I_N & I_N & \cdots & I_N \\ \hat{H}^{(0)} & \hat{H}^{(1)} & \cdots & \hat{H}^{(M-1)} \end{pmatrix}$$

where $I_N$ denotes the N×N identity matrix and $$\hat{H} = (\hat{H}^{(0)} \hat{H}^{(1)} \ldots \hat{H}^{(M-1)})$$

is a $\Delta \times MN$ matrix. The family of practical codes proposed herein chooses, for $k \in \{0, \ldots, M-1\}$, $i \in \{0, \ldots, \Delta-1\}$, $j \in \{0, \ldots, N-1\}$, $$\hat{H}_{i,j}^{(k)} = X_{j,k}^{2^i} \quad (19)$$

where the $\{X_{j,k}\}$ are all distinct and elements of $GF(2^p)$. The primary reason for choosing this construction is because in a field with characteristic 2 (such as field $GF(2^p)$), for any a, b elements of such field results in $a^2 + b^2 = (a+b)^2$.

As a consequence, the matrices $\hat{H}^{(-k)}$, defined at the beginning of the Diff-MDS codes section above, can be written in a manner similar to (19), creating an algebraic structure that can be exploited. Specifically, the M-1 components of $\hat{H}^{(-k)}$ have the form, $l \neq k$, $$(\hat{H}^{(l)} - \hat{H}^{(k)})_{i,j} = X_{j,l}^{2^i} - X_{j,k}^{2^i} \quad (20)$$
$$= (X_{j,l} - X_{j,k})^{2^i}.$$

This enables a systematic analysis of the properties of the matrices $\hat{H}^{(-j)}$ which will connect the theory of memory storage array codes with the form (19) with the theory of binary codes. Not any choice for $\{X_{i,j}\}$ will be suitable for these goals; to find good choices the binary codes connection will first be established and then an embodiment of a design technique will be given.

Connection to Binary Codes.

In this, and the following subsection, an embodiment will make use of the fact that an element of $GF(2^p)$ can be described using p elements of $GF(2)$ using any given basis for $GF(2^p)$ over $GF(2)$. If $a \in 2 GF(2p)$, denoted by $[a]$ is the binary column vector containing the p coefficients of the expansion of a using the given basis, indexed $[a]_0$ through $[a]_{p-1}$:

$$a \in GF(2^p) \leftrightarrow [a] \in GF(2)^p$$

$$[a] = \begin{pmatrix} [a]_0 \\ [a]_1 \\ \vdots \\ [a]_{p-1} \end{pmatrix}$$

The central tool for this section is the following result, which is a direct consequence of Lemma 1 of [11]:

Lemma 3: Let A be a r×n matrix with elements in $GF(2^p)$ with the property that for $i \in \{2, \ldots, r\}$, $$A_{i,j} = A_{i-1,j}^2$$

Furthermore, let B be the p×n binary matrix given by $$B = ([A_{0,0}] [A_{0,1}] \ldots [A_{0,n-1}])$$

Then $d(A) = \min(r+1, d(B))$ where $d(A)$ is the minimum Hamming distance measured in symbols from $GF(2^p)$ and where $d(B)$ is the minimum Hamming distance measured in bits.

In order to connect this Lemma with the goal of computing $^d\text{diff}(\hat{H})$ for a code of the form (19), refer to FIG. 12, where a portion of the process of computing $d(H^{(-0)})$ is illustrated. FIG. 12 shows an embodiment of how a binary code is derived from the original parity check matrix $\hat{H}$, which is assumed to be of the form (19). The (binary) minimum distance of the binary code shown at the bottom determines the $GF(2^p)$ minimum distance. At the top, is the $\Delta \times NM$ matrix $\hat{H}$. The minimum distance of the $(\hat{H}^{(-j)})$ codes depends only the first row, as per Lemma 3. In the subsequent step, $(\hat{H}^{(-0)})$ is shown and restated to incorporate (20). In the last step, take the first row of the previous step, which is comprised of $N(M-1)$ elements of $GF(2^p)$ and substitute each element with a column vector comprised of p bits. This column vector contains the coefficients of the expansion of the corresponding $GF(2^p)$ element using the given basis for $GF(2^p)$ over $GF(2)$. The resulting p×NM binary matrix is denoted by $B^{(-0)}$. This example is taken advantage of to similarly define, by an omitted extension, $B^{(-j)}$ for $j \in \{1, \ldots, M-1\}$ Given Lemma 3, it can be seen that $d(H^{(-j)})=\min(\Delta+1, d(B^{(-j)}))$ and thus $$d_{\mathit{diff}}(\hat{H}) = \min_{j\in\{0,\ldots,M-1\}} \min(\Delta+1, d(B^{(-j)}))$$
$$= \min\left(\Delta+1, \min_{j\in\{0,\ldots,M-1\}} d(B^{(-j)})\right).$$

Thus if in particular $d(B^{(-j)})=\Delta+1\_+1$ for every $j\in\{0,\ldots,M-1\}$, then $d_{\mathit{diff}}(\hat{H})=\Delta+1$ and $\hat{H}$ is a diff_MDS code.

Selection method for the $\{X_{i,j}\}$.

A family of codes leading to a parity check matrix with the property that $d_{\mathit{diff}}(\hat{H})=\Delta+1$ (and hence diff-MDS) can be constructed by choosing for $i\in\{0,\ldots,N-1\}$, $j\in\{0,\ldots,M-1\}$, $$X_{i,j}=\gamma_i\beta_j \quad (21)$$

where p is assumed to be a multiple of $\Delta$, $\beta_j\in GF(2^{p/\Delta})$, $\gamma_i\in GF(2^p)$, and where the following holds:

1) If one chooses any subset from $\{\beta_0,\ldots,\beta_{M-1}\}$ with cardinality $\Delta'$, the elements of this subset are linearly independent over GF(2). In here, $\Delta'=\Delta$ if $\Delta$ is even, otherwise $\Delta'=\Delta+1$.

2) If one chooses any subset from $\{\gamma_0,\ldots,\gamma_{N-1}\}$ with cardinality $\Delta$, the elements of this subset are linearly independent over $GF(2^p/\Delta)$.

In general, one may have to make p sufficiently large to satisfy these requirements.

An alternate construction with the $\gamma$'s in the "small field" and $\beta$'s in the "large field" is possible. In this alternate method, $\beta_j\in GF(2^p)$, $\gamma_i\in GF(2^{p/\Delta})$, and the following holds:

1) If one chooses any subset from $$\{\gamma_0,\ldots,\gamma_{N-1}\}$$

with cardinality $\Delta$, the elements of this subset are linearly independent over GF(2).

2) If one chooses any subset from $$\{\beta_0,\ldots,\beta_{M-1}\}$$

with cardinality $\Delta+1$, the elements of this subset are linearly independent over $GF(2^{p/\Delta})$. Its proof of correctness is similar to the former option and hence it is omitted.—only the former option is discussed here.

It is now proven that $d_{\mathit{diff}}(\hat{H})=\Delta+1$ the conditions above are satisfied. Clearly, $d_{\mathit{diff}}(\hat{H})\leq\Delta+1$. It is desired to show that for all $$j\in\{0,\ldots,M-1\}, \min_{j\in\{0,\ldots,M-1\}} d(B^{(-j)})\geq\Delta+1,$$

where it is reinforced that $d(B^{(-j)})$ denotes a binary minimum Hamming distance. It is demonstrated that the multiplication of the matrix $B^{(-j)}$ times any nonzero binary vector with length $N(M-1)$ and weight no larger than $\Delta$ results in a nonzero vector. This will imply that $$\min_{j\in\{0,\ldots,M-1\}} d(B^{(-j)})\geq\Delta+1.$$

Let $y^{(i)}\in GF(2)^N$ for $i\in\{0,\ldots,M-1\}$. An embodiment will focus on the computation:

$$B^{(-j)}\begin{pmatrix} y^{(0)} \\ \vdots \\ y^{(j-1)} \\ y^{(j+1)} \\ \vdots \\ y^{(M-1)} \end{pmatrix} = \sum_{i\neq j}\sum_{l=0}^{N-1}[(X_{l,i}-X_{l,j})y_l^{(i)}]$$

where in the above $y_l^{(i)}$ is regarded as an element of $GF(2^p)$ for the purposes of multiplication. This matrix/vector product can be rewritten as:

$$\sum_{i\neq j}\sum_{l=0}^{N-1}[X_{l,i}y_l^{(i)}] + \sum_{l=0}^{N-1}\left[X_{l,j}\left\{-\sum_{i\neq j}y_l^{(i)}\right\}\right] = \left[\sum_{i\in\{0,\ldots,M-1\}}\sum_{l=0}^{N-1}X_{l,i}y_l^{(i)}\right]$$

where similarly the quantity in curly brackets is regarded as an element of $GF(2^p)$ and where an embodiment has defined $$y_l^{(j)} \triangleq -\sum_{i\neq j} y_l^{(i)} \quad (22)$$

Now write:

$$\sum_{i=0}^{M-1}\sum_{l=0}^{N-1}X_{l,i}y_l^{(i)} = \sum_{i=0}^{M-1}\sum_{l=0}^{N-1}\gamma_l\beta_i y_l^{(i)} \quad (23)$$
$$= \sum_{l=0}^{N-1}\gamma_l\left(\sum_{i=0}^{M-1}\beta_i y_l^{(i)}\right)$$
$$\triangleq \sum_{l=0}^{N-1}\gamma_l\eta_l$$

Let $l$ be fixed. If $y_l^{(i)}=1$ for any $i\in(0,\ldots,M-1)$, it is claimed that $\eta_l\neq 0$: and otherwise $\eta_l=0$. The latter is obvious. To see the former, note that there are at most $\Delta+1$ elements of $\{y_l^{(0)},\ldots,y_l^{(M-1)}\}$ that are nonzero. To be more precise, if $\Delta$ is even, then the maximum number of nonzero elements in this set is actually $\Delta$, because in (22), whenever there is an even number of nonzero summands in the right hand side, $y_l^{(j)}=0$. On the other hand, if $\Delta$ is odd, then the maximum number of nonzero elements is $\Delta+1$, for a similar reason.

Since $\eta_l$ is a linear combination of the $\{\beta_i\}$ using coefficients from GF(2), due to the linear independence property that we assume of the $\{\beta_i\}$ it is concluded that $\eta_l\neq 0$ if $y_l^{(i)}=1$ for any $i\in\{0,\ldots,M-1\}$, as desired. Finally note that $|\{l\in\{0,\ldots,N-1\}:\eta_l\neq 0\}|\leq\Delta$ since there are at most $\Delta$ nonzero values in the $\{y^{(i)}\}^{i\neq j}$ collectively. Note also that $|\eta_l|\in GF(2^{p/\Delta})$. Thus in (23), the embodiment is mixing the $\{\gamma_l\}$ using at most $\Delta$ elements of $GF(2^{P/\Delta})$ and by the assumptions on the $\{\gamma_l\}$, the result of the combination must be nonzero, since at least one of the $\eta_l$ is nonzero. This proves that $$d(B^{(-j)})\geq\Delta+1$$

as desired.

Diff-MDS Embodiment: A Comparison to Reed-Solomon Codes.

As discussed in the Preliminaries of the Diff-MDS embodiment, Reed-Solomon codes may be used for the memory array storage problem described herein; in here H would no longer have the form (11) and instead would be the parity check matrix of a Reed-Solomon code. The main difficulty that can arise in their application to the main memory of a server relates to the extraordinarily high bandwidth and low decoding latencies and small chip area footprint that this setting demands.

First, it is pointed out that if $NM < 2^p$, then a (generally shortened) Reed-Solomon code exists that is at least as strong as a diff-MDS code (here the existence of the latter is assumed). (Note that in this section b=p.) For example, if a general decoder organization similar to that in the proof of Theorem 1 is employed, then an analogous result can be proved in which (13, 14, 15, 16) are substituted with:

$$u + t_c^{(0,u)} + t_d^{(0,u)} < \min(2\Delta - u, N + \Delta + 1)$$
$$u + t_d^{(0,u)} < \Delta + 1$$
$$u + t_c^{(1,u)} + t_d^{(1,u)} < \Delta + 1$$
$$1 - \frac{M-1}{2^{p(\Delta-u)}}.$$

Now turn to decoding complexity; in what follows all operations discussed are in $GF(2^p)$ unless stated otherwise. In both diff-MDS and Reed-Solomon codes start by computing the syndromes of the retrieved vector. It is easy to see that the z syndrome can be computed using $N(M-1)$ addition operations and that the s syndrome can be computed using approximately (and at most) $\Delta NM$ additions and multiplications, where the multiplications have one of its operands known at code design time. Syndrome computation in Reed-Solomon codes can be accomplished using the obvious technique using approximately $(N+\Delta)$ NM additions and multiplications again with one of the operands of the latter being known at design time. Nonetheless, in some instances techniques originally developed for the field of complex numbers can be exploited to argue that this operation can be accomplished using $O(NM \log^2 NM)$ operations. It is noted that these techniques rely on the ability to compute efficiently an interpolating polynomial and on the existence of a Fast Fourier Transform. Efficient methods for solving these in finite fields can be derived from algorithms in complex fields, nonetheless the finite field setting places restrictions on the block lengths for which such efficient operations are known to exist; in particular, $2^p-1$ should preferably have many factors. Note that in order to obtain a conservative estimate of the relative computational complexity advantages of diff-MDS codes over Reed-Solomon codes no consideration is made of any benefits that the proposed diff-MDS codes can derive from exploiting the algebraic structure given by (19) and/or (21).

From this discussion it is clear that if NM is large with respect to $\Delta$, then the complexity of computing syndromes for expurgated simple parity check codes can be Much lower than that of Reed-Solomon codes. This is not very surprising, since $\Delta$ relatively "small" means that most of the errors that one will be solving are "large" column errors and Reed-Solomon codes are not specifically designed for this setting while expurgated simple parity check codes are. Moreover, in specific problem instances, efficient "super-fast" algorithms cited above may not be known, since the associated complexity estimates are asymptotic, further magnifying the computational advantage of diff-MDS codes.

Assuming that the problem is simply to find the error magnitude of a channel that has been marked and no chip marked and no additional error, then it is easy to see that in the case of an expurgated simple parity check code, the syndrome z is the channel error magnitude. To achieve the corresponding with a Reed-Solomon code, one needs to decode N erasures. A standard way of doing this is by solving an N×N system of V e=s where V is a Vandermonde matrix and s is a vector with N syndromes of the Reed-Solomon code. It is well known that this system of equations can be using $O(N^2)$ multiplications and additions in $GF(2^p)$. As before, by using more advanced techniques the complexity of these computation may be improved, in some instances, to $O(N \log^2 N)$, but it can certainly not be reduced to no computation at all which is what it is competing against.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As described above, embodiments can be embodied in the form of computer-implemented processes and apparatuses for practicing those processes. In exemplary embodiments, the invention is embodied in computer program code executed by one or more network elements. Embodiments include a computer program product on a computer usable medium with computer program code logic containing instructions embodied in tangible media as an article of manufacture. Exemplary articles of manufacture for computer usable medium may include floppy diskettes, CD-ROMs, hard drives, universal serial bus (USB) flash drives, or any other computer-readable storage medium, wherein, when the computer program code logic is loaded into and executed by a computer, the computer becomes an apparatus for practicing the invention. Embodiments include computer program code logic, for example, whether stored in a storage medium, loaded into and/or executed by a computer, or transmitted over some transmission medium, such as over electrical wiring or cabling, through fiber optics, or via electromagnetic radiation, wherein, when the computer program code logic is loaded into and executed by a computer, the computer becomes an apparatus for practicing the invention. When implemented on a general-purpose microprocessor, the computer program code logic segments configure the microprocessor to create specific logic circuits.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for locating and correcting a memory channel failure, or alternately for correcting up to t_c chip failures and detecting up to t_d chip failures in the presence of up to u chips that are marked as suspect, wherein u is a value equal to or greater than zero, t_c represents a number of simultaneous chip errors configured to be corrected and t_d represents a number of simultaneous chip errors configured to be detected or corrected, the method comprising:
computing syndromes of data retrieved from a memory in a memory system comprising M channels;
performing a first stage of decoding using a decoder configured to perform u-erasure, t_c error correction, and t_d error detection, the performing a first stage resulting in recovering an estimate of correctable errors affecting the data or in declaring an uncorrectable error state;

declaring an uncorrectable error state in response to a syndrome of the recovered estimated errors not being the same as the computed syndromes of data retrieved from the memory;

performing a second stage of decoding in response to the uncorrectable error state being declared, the performing a second stage comprising attempting to correct u erasures and a channel error in M iterations, changing a channel location in each iteration; and declaring a correctable error state in response to exactly one of the M iterations being successful.

* * * * *